United States Patent [19]
Ito et al.

[11] Patent Number: 5,856,695
[45] Date of Patent: Jan. 5, 1999

[54] BICMOS DEVICES

[75] Inventors: Akira Ito, Palm Bay; Michael David Church, Sebastian, both of Fla.

[73] Assignee: Harris Corporation, Palm Bay, Fla.

[21] Appl. No.: 917,635

[22] Filed: Jul. 20, 1992

Related U.S. Application Data

[63] Continuation-in-part of Ser. No. 785,400, Oct. 30, 1991, abandoned.

[51] Int. Cl.6 ............................ H01L 27/02; H01L 29/68; H01L 29/72
[52] U.S. Cl. ......................... 257/370; 257/378; 257/401; 257/328
[58] Field of Search ................................... 257/370, 378, 257/401, 408, 335, 328; 437/31

[56] References Cited

U.S. PATENT DOCUMENTS

| | | | |
|---|---|---|---|
| 5,119,162 | 6/1992 | Todd et al. ............................ | 257/370 |
| 5,148,255 | 9/1992 | Nakazato et al. ....................... | 257/378 |
| 5,169,794 | 12/1992 | Iranmanesh ............................. | 437/57 |
| 5,216,217 | 6/1993 | Takagi et al. .......................... | 257/370 |

*Primary Examiner*—Minh-Loan Tran
*Assistant Examiner*—Alexander Oscor Williams
*Attorney, Agent, or Firm*—Jaeckle Fleischmann & Mugel, LLP

[57] ABSTRACT

A BiCMOS process which provides both low voltage (digital) and high voltage (analog) CMOS devices. The high voltage NMOS devices have a compensated drain formed by the NPN and PNP base implants. The PNP base plus the high voltage NMOS drain carrier concentrations are both optimized by adjustment of the two variables N base implant dose and P base implant dose; this determines the NPN base carrier concentration which turns out to provide good NPN characteristics. Low voltage NMOS source and drain implants employ a higher dose and may also be used for the high voltage NMOS source. The NPN emitter doping may also be used for a contact to the high voltage NMOS drain contact.

4 Claims, 35 Drawing Sheets

BICMOS DEVICES

CROSS-REFERENCE TO RELATED APPLICATIONS

This application is a continuation-in-part of U.S. patent application Ser. No. 07/785,400, filed Oct. 30, 1991, now abandoned, which is hereby incorporated by reference. Commonly assigned copending U.S. patent application Ser. Nos. 07/785,325 and 07/785,395, also filed Oct. 30, 1991, disclose related subject matter.

FIELD OF THE INVENTION

The present invention relates to electronic semiconductor devices and methods of fabrication, and, more particularly, to semiconductor devices and fabrication methods integrating both bipolar and field effect devices.

BACKGROUND AND SUMMARY OF THE INVENTION

Demands for increased performance and complexity for integrated circuits have led to the circuits including both CMOS transistors for high packing density and bipolar transistors for high power and speed. Such BiCMOS circuits provide particular advantages for mixed mode (analog plus digital) integrated circuits which can combine the low noise characteristics of bipolar transistors in analog subcircuits and still use well known CMOS digital subcircuits. See for example, R. Haken et al, "BiCMOS Processes for Digital and Analog Devices," Semiconductor International 96 (June 1989).

However, analog circuits typically will operate with both positive and negative power supplies and at higher voltages than the single power supply digital circuit. For example, digital CMOS circuits typically operate between 0 and +5 volts, whereas analog circuits may operate with –5 volts, +5 volts. Further, analog circuits benefit from the use of CMOS transistors in addition to bipolar transistors; thus a mixed mode BiCMOS circuit may have CMOS transistors operating between 0 and +5 volts plus other CMOS transistors operating between –5 and +5 volts. But to achieve maximum performance from the digital (low voltage) NMOS transistors the source and drain implant doses are maximized to the extent where hot electron failures begin to appear. And using the same source and drain implant doses for the analog (high voltage) NMOS transistors will result in failure due to the higher operating voltages of the analog transistors. Thus there is a problem of a tradeoff between digital NMOS transistor performance and analog NMOS transistor performance in BiCMOS integrated circuits.

In BiCMOS processes the photomask count is typically high, and increasing the number of photomasks to obtain additional devices is only used as a last resort. Thus for a BiCMOS process which provides both NPN and PNP transistors, the implant to form the base of the PNP transistors seems to be a candidate for simultaneous formation of the source and drain (or just drain in the asymmetrical case) of the high voltage NMOS transistors because the implant dose for base is most similar to that used in a lightly doped drain of a high voltage NMOS transistor. However, to achieve a PNP transistor of reasonable performance, the base implant must be of fairly high energy to provide a satisfactory base width due to the encroachment of the faster diffusing boron dopants forming the P+emitter. But if upwards of 1 MeV energy for the base implant is not available, then a higher dose must be used. Then the high voltage NMOS transistor becomes prone to hot electron degradation as well as low snapback holding voltage.

The present invention provides BiCMOS processes and devices with low voltage and high voltage NMOS transistors having differing drain (and source) dopings but without an additional photomask. Rather, the high voltage NMOS transistors have a compensated lightly doped drain formed by use of both the NPN transistor base implant and the PNP transistor base implant. Because a boron implant can be deeper and diffuse more quickly, it is generally true that the NPN base implant dose will be less than but of the same order of magnitude as the PNP base implant dose. The combination of the two base implants yields a drain (and source) which is N type and more lightly doped than the PNP base alone. Hence, such high voltage NMOS transistors should have greater hot electron immunity and snapback holding voltage. Ohmic contact to the lightly doped drain (and source) may be by use of the low voltage NMOS transistor source/drain implant or the NPN transistor emitter implant and offset from the high voltage NMOS transistor gate.

BRIEF DESCRIPTION OF THE DRAWINGS

The present invention will be described with reference to the accompanying drawings which are schematic for clarity.

DESCRIPTION OF THE PREFERRED EMBODIMENTS

The first preferred embodiment method provides both high performance bipolar transistors and high packing density CMOS transistors. This permits integration of mixed-mode analog-digital circuits without loss of performance over multiple chip implementations. Indeed, analog circuits often require bipolar devices due to their high transconductance, low 1/f noise, and ease of matching Vbe, whereas digital circuits often require CMOS devices due to their high packing density, high noise threshold, and low power dissipation. The method provides the following devices: an NPN transistor with a beta of at least 80 and a cutoff frequency $f_T$ of at least 4 GHz and a breakdown voltage of at least 10 volts, an isolated PNP transistor with a beta of at least 60 and an $f_T$ of at least 1.5 GHz, a super beta NPN transistor with a beta of at least 300, a substrate PNP transistor, 5-volt NMOS and PMOS for digital circuitry, 10-volt NMOS and PMOS for analog circuitry, an isolated poly-to-poly capacitor using poly oxide, and a precision laser-trimmable thin-film NiCr resistor for optimizing circuit performance after fabrication. The power supplies would be at –5 volts, ground, and +5 volts with the substrate at about –5 volts. The digital CMOS operates between ground and +5 volts despite the substrate bias.

Figure 1A:
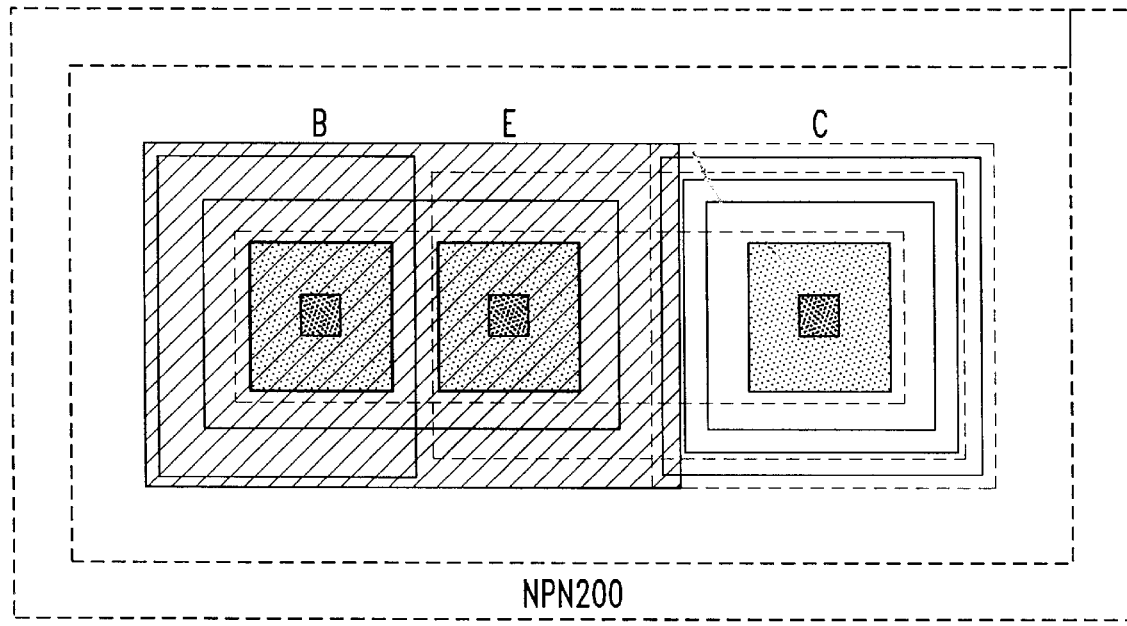
FIGS. 1a–f are layouts for some preferred embodiment devices.
Figure 1B:
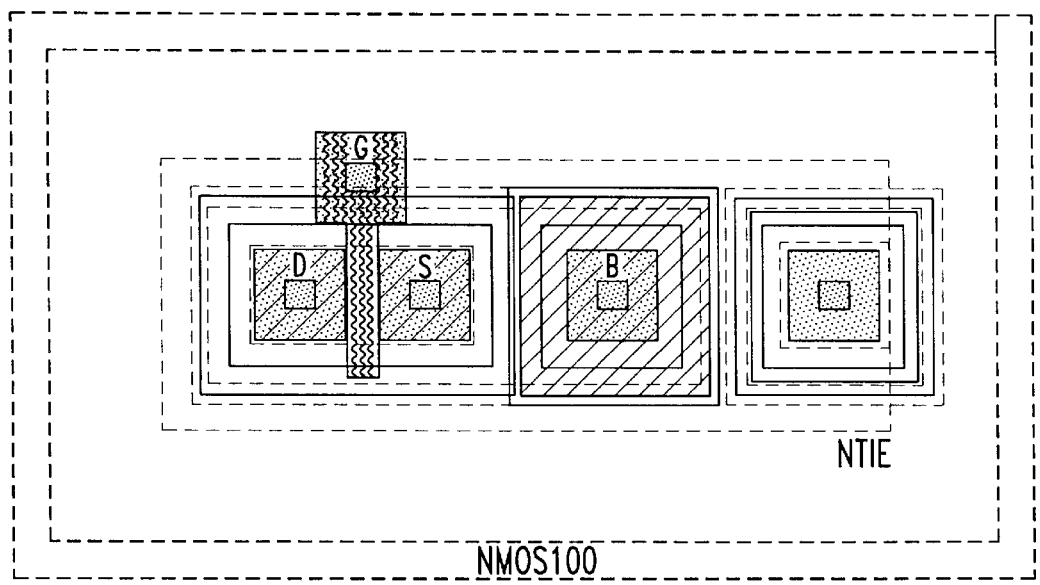
Figure 1C:
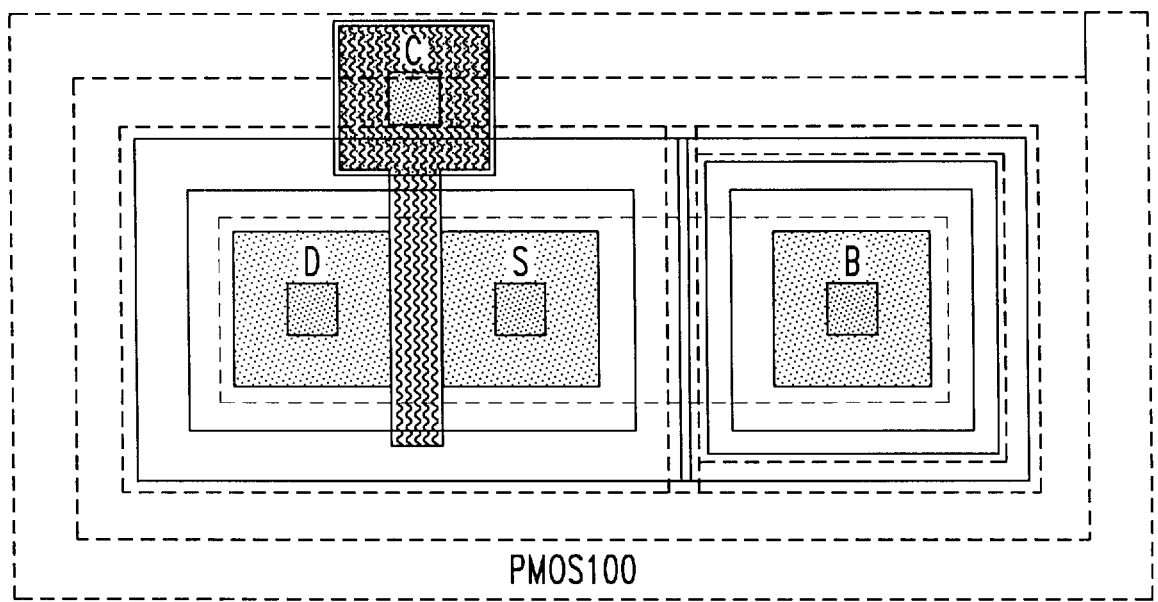
Figure 1D:
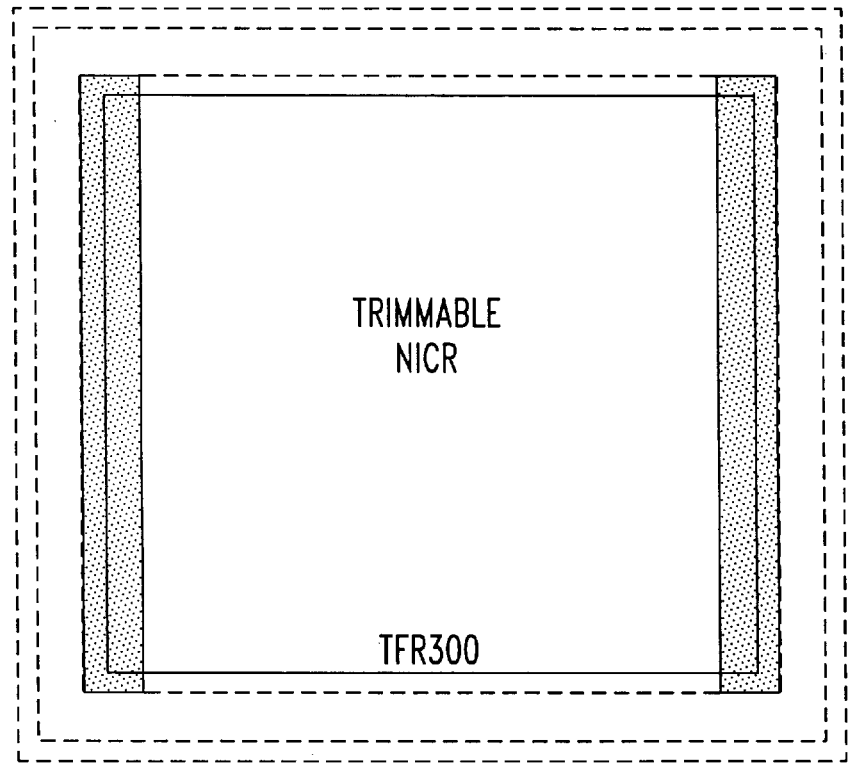
Figure 1E:
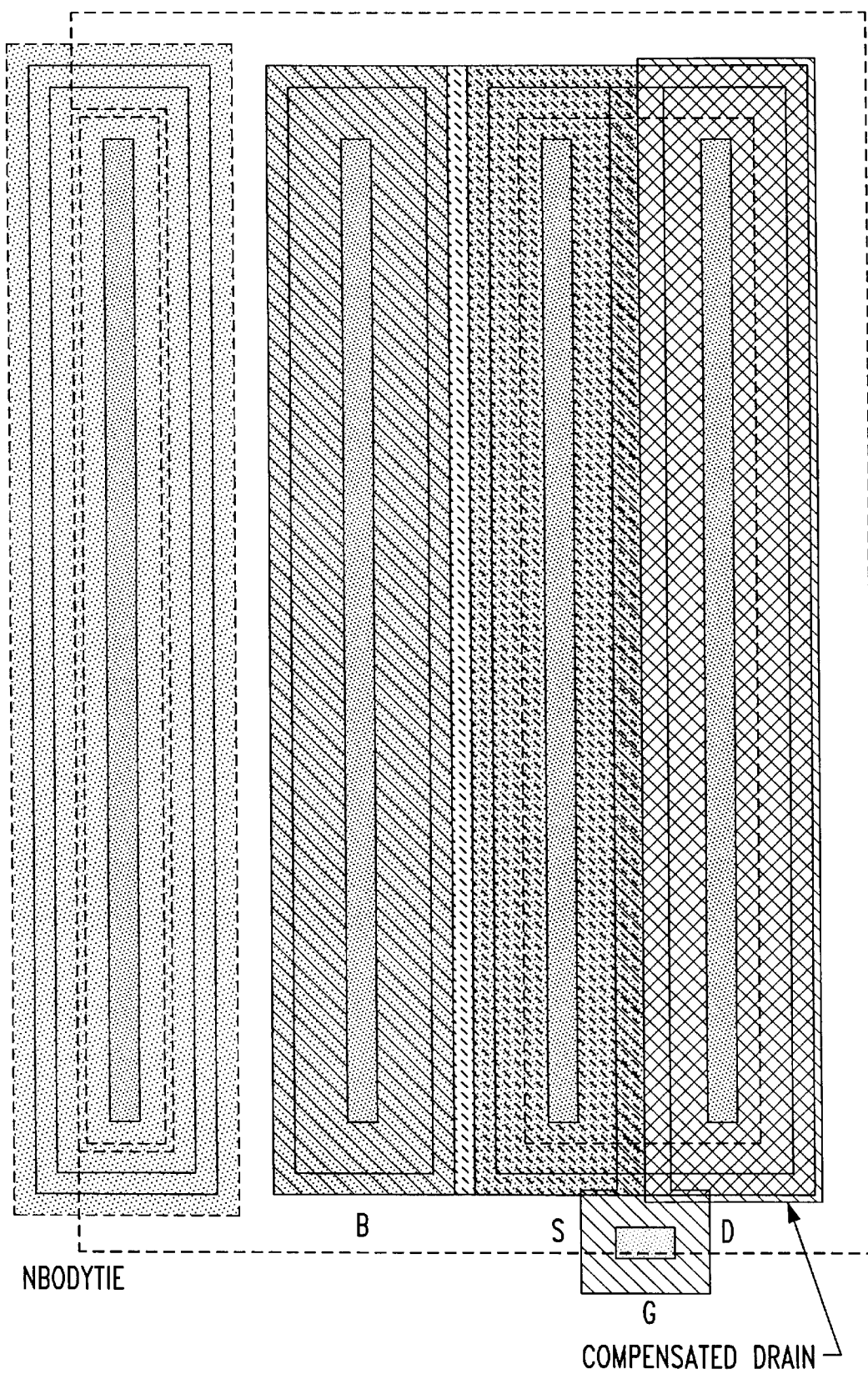
Figure 1F:
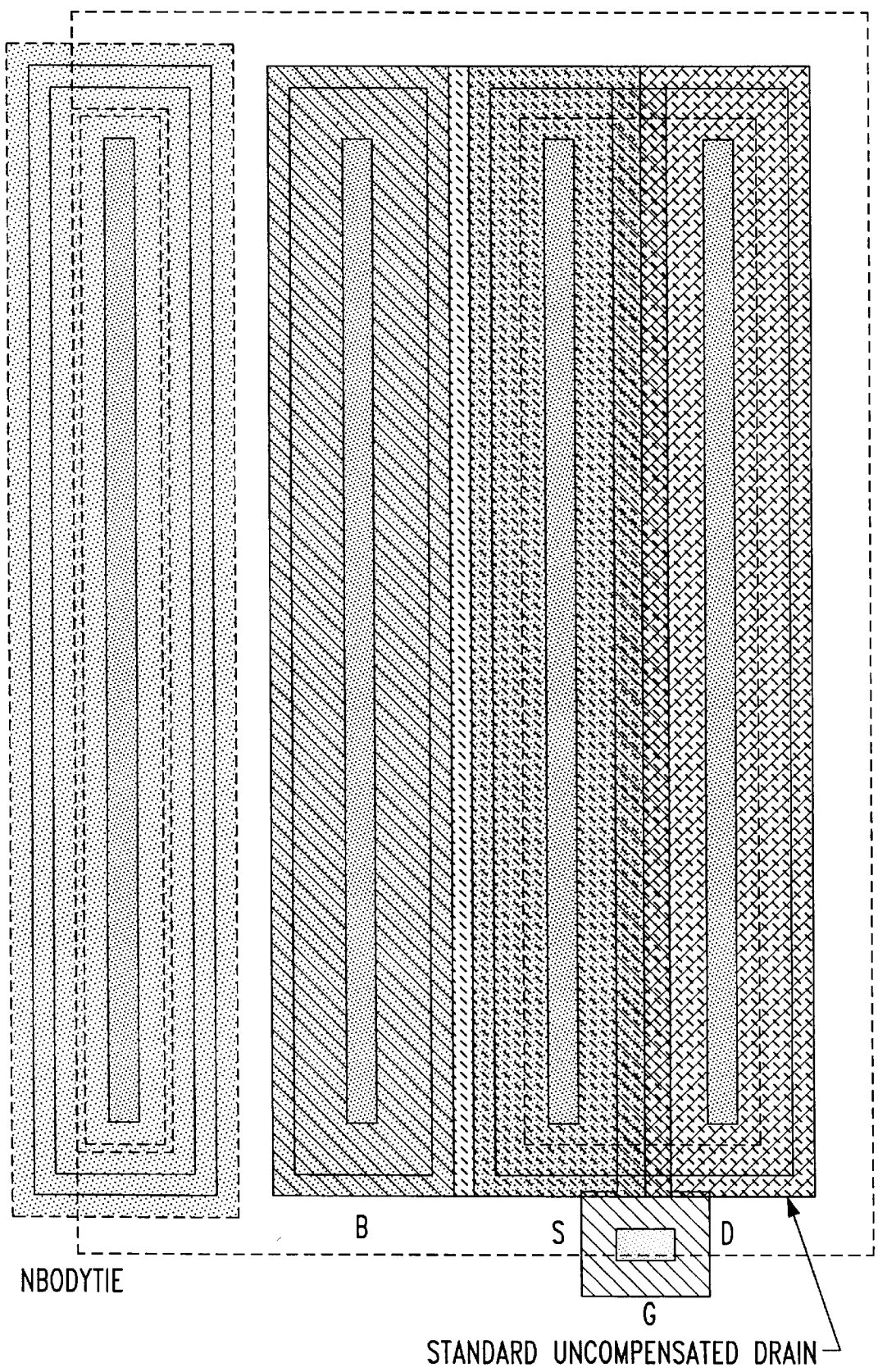

FIGS. 1a–e show plan view layouts of typical preferred embodiment devices available in an integrated circuit fabricated with the first preferred embodiment method of fabrication. In particular, FIG. 1a shows an NPN transistor; FIG. 1b a low voltage NMOS transistor; FIG. 1c a low voltage PMOS; FIG. 1d a nickel-chromium resistor prior to trimming; and FIG. 1e a high voltage NMOS transistor. The high voltage NMOS differs from the low voltage NMOS in that the drain has compensated doping as more fully described in the following. For comparison, FIG. 1f shows a low voltage NMOS with the same dimensions as the high voltage NMOS of FIG. 1e.

Figure 2B:
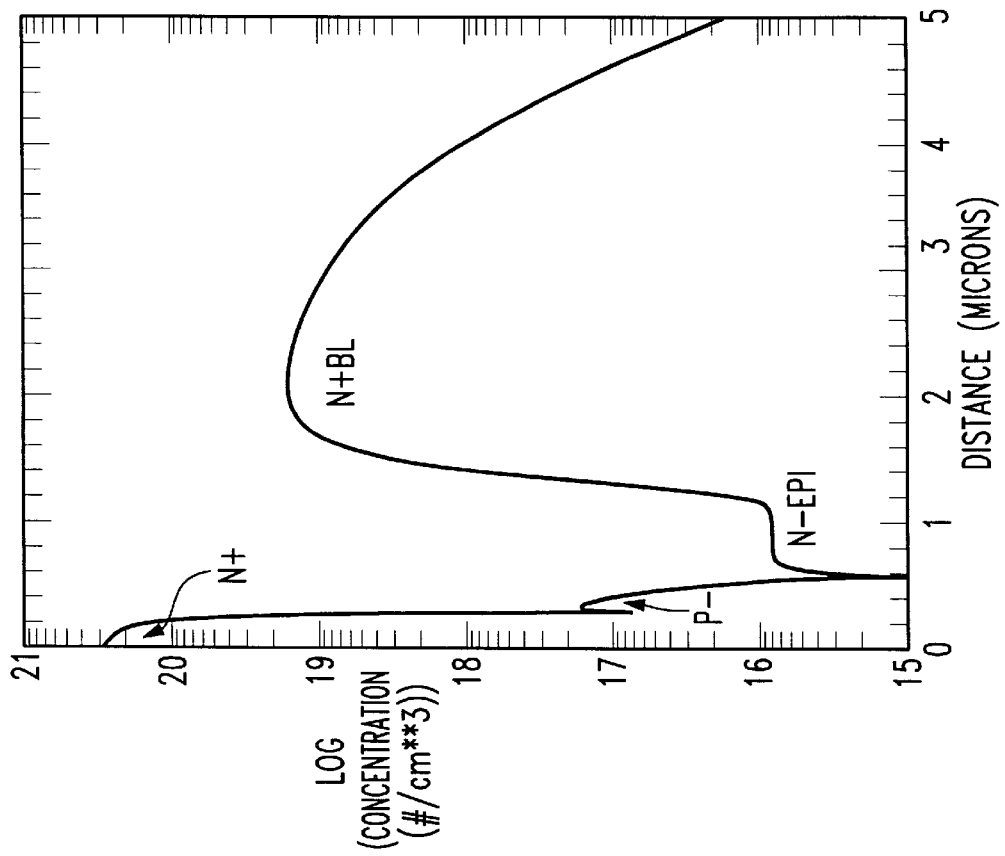
FIGS. 2a–h are profiles for some preferred embodiment devices.
Figure 2A:
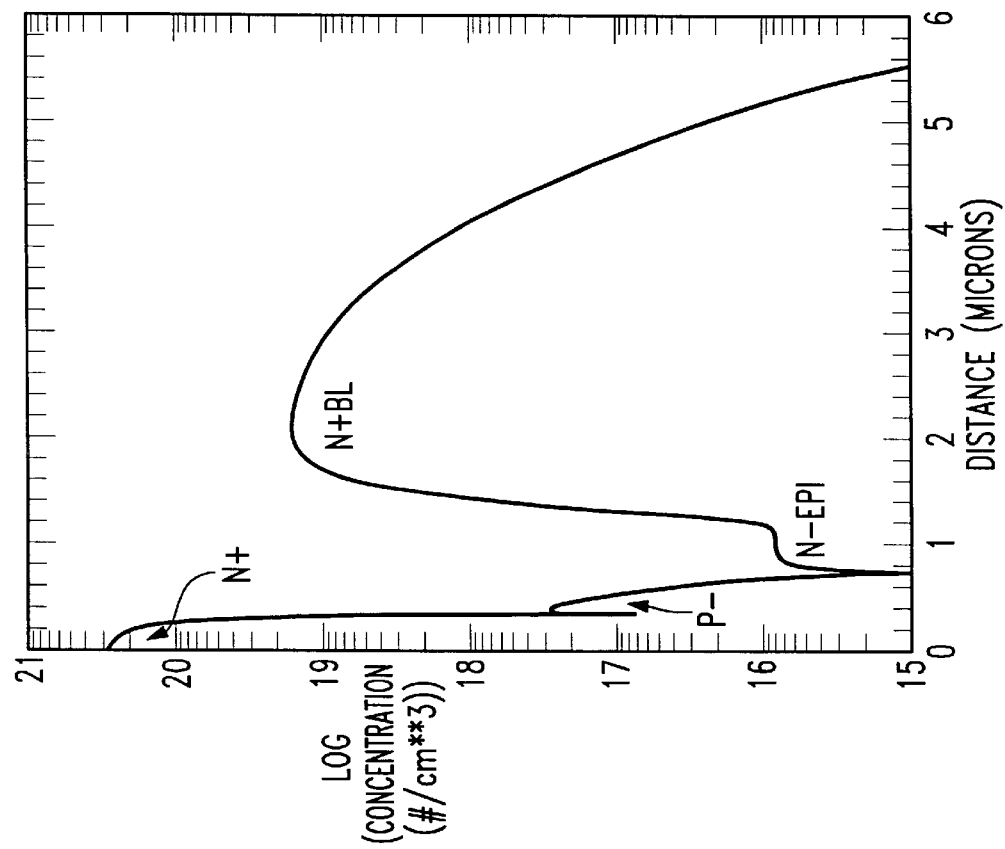
Figure 2D:
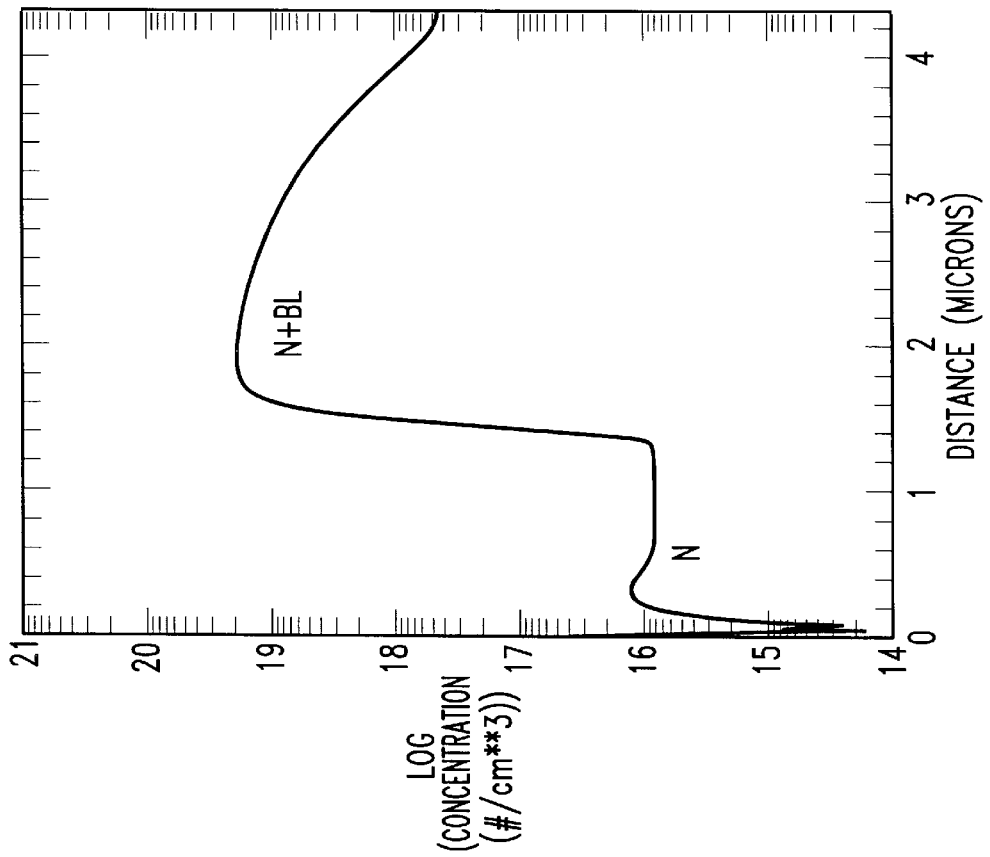
Figure 2C:
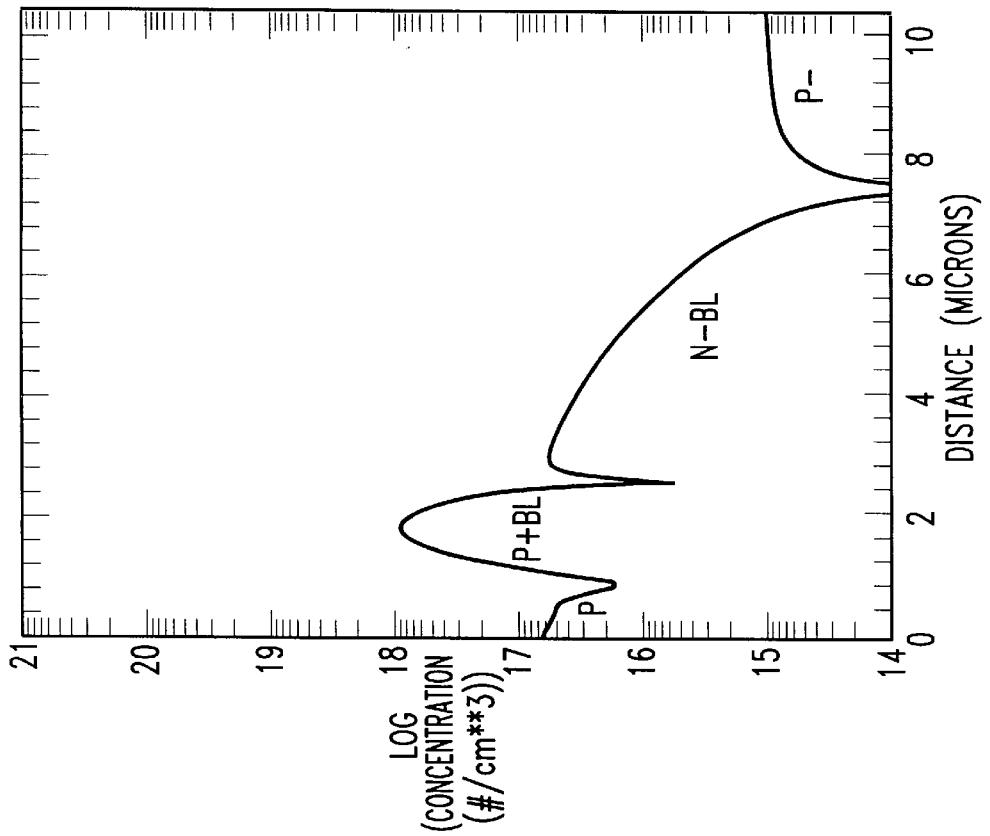
Figure 2E:
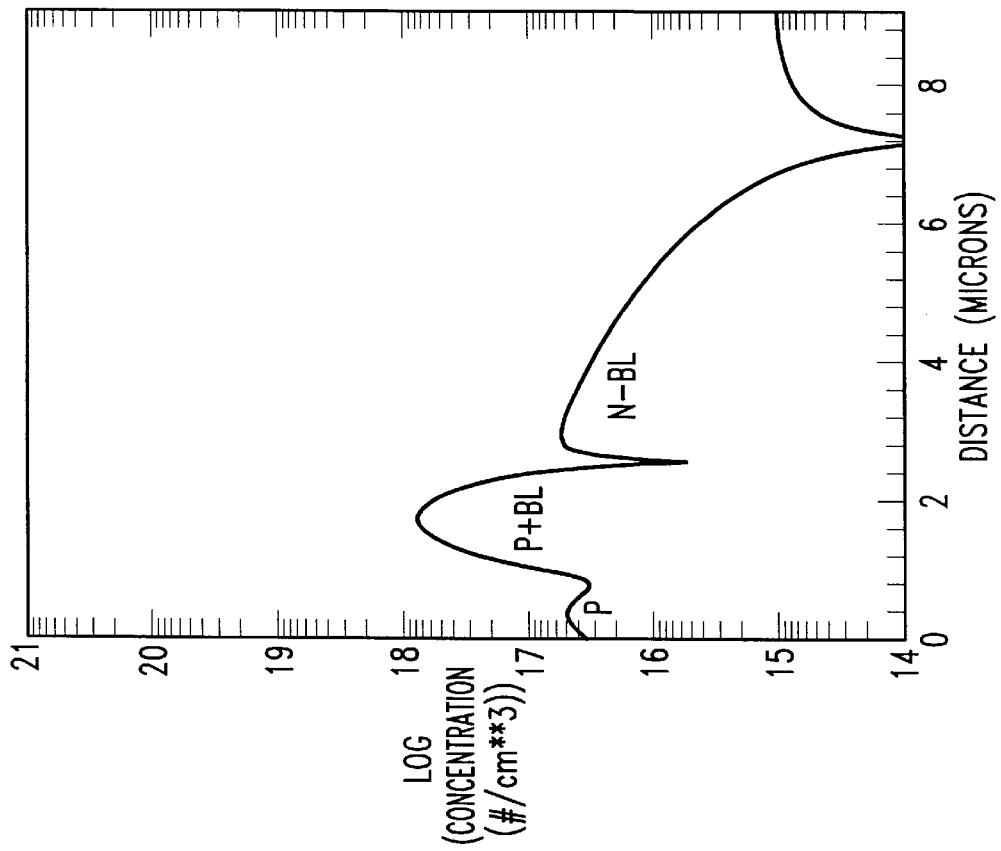
Figure 2F:
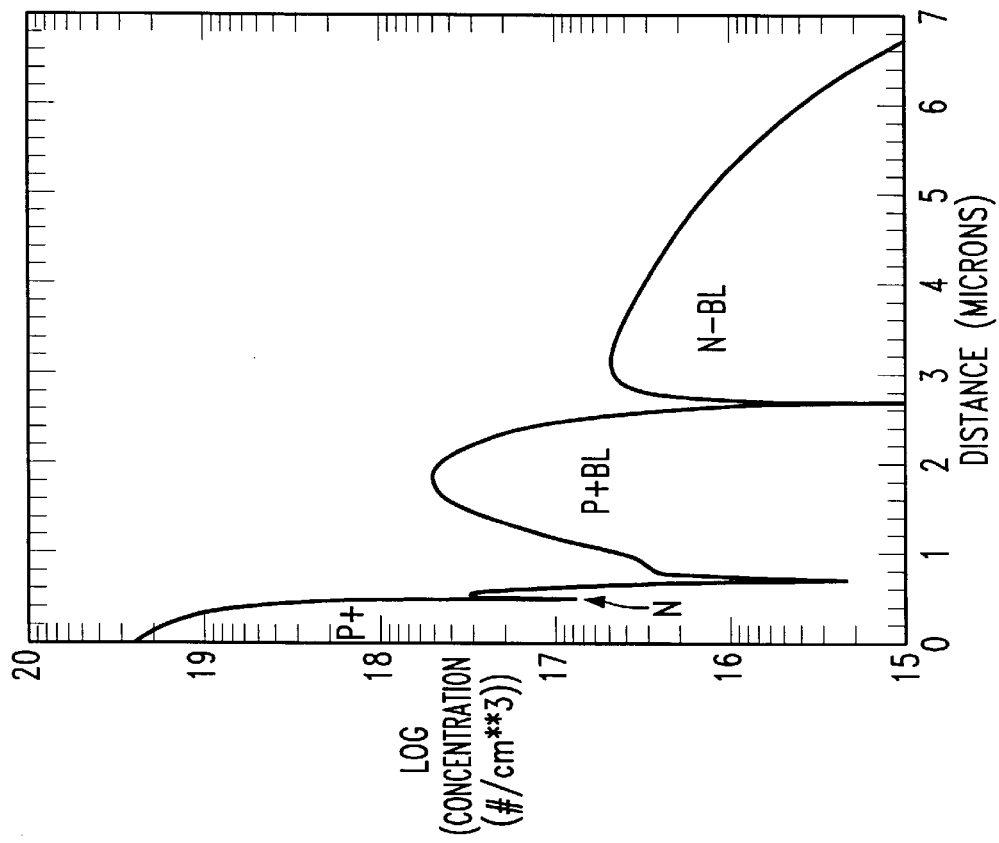
Figure 2H:
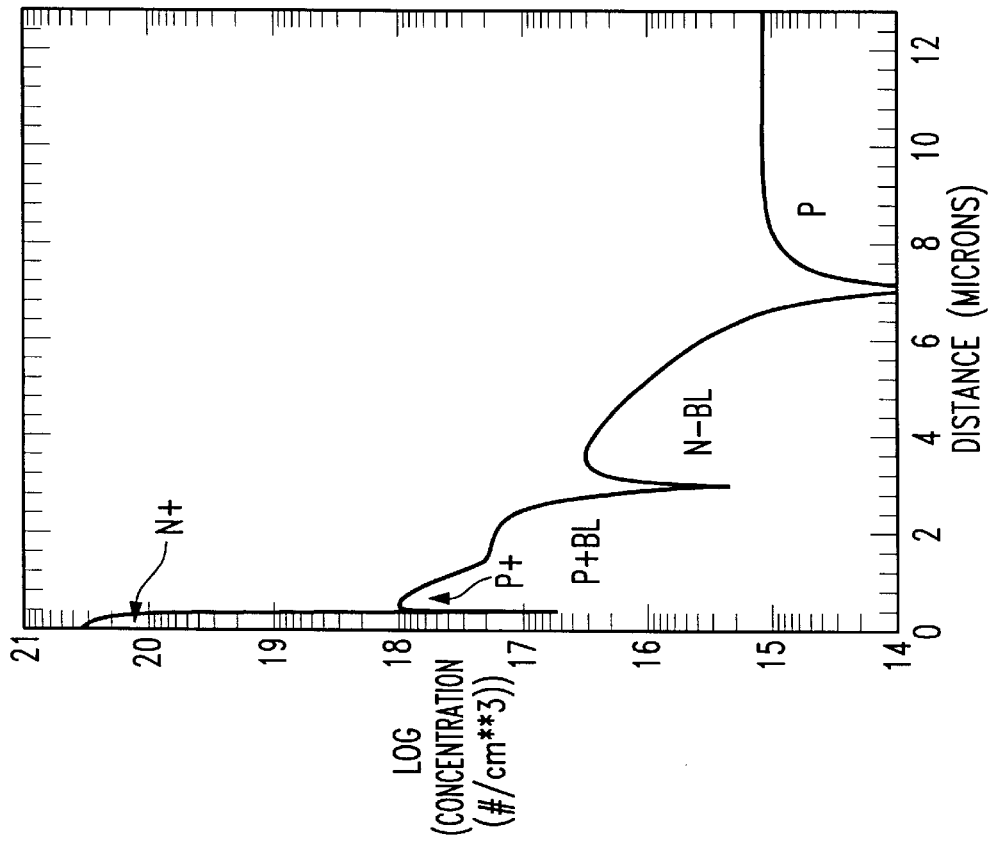
Figure 2G:
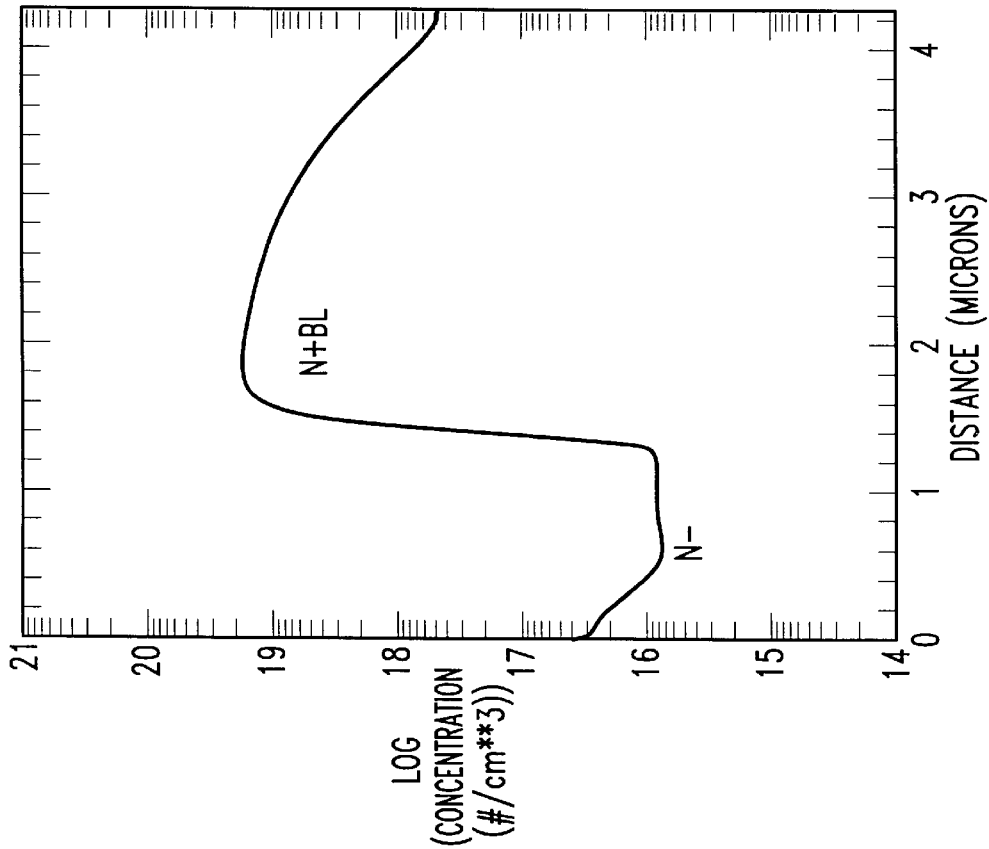

FIGS. 2a–h illustrate the doping profiles of preferred embodiment devices. FIG. 2a is a vertical section through a NPN transistor showing emitter to the left, base, collector, and buried layer to the right; FIG. 2b a vertical section through a high beta NPN; FIG. 2c a vertical section through the channel region of a low voltage NMOS; FIG. 2d a vertical section through the channel region of a low voltage PMOS; FIG. 2e a vertical section through a PNP; FIG. 2f a vertical section through the channel region of a high voltage NMOS; FIG. 2g a vertical section through the channel region of a high voltage PMOS; and FIG. 2h a vertical section through a Zener diode.

The effective gate lengths are typically 0.9 $\mu$m and the emitter size about 1.4 $\mu$m square although other sizes are available with the same process steps.

The method is modular so that various groups of steps may be omitted if a circuit does not demand all of the foregoing devices; however, the method uses only 21 mask levels to fabricate all of these devices. In addition, one further mask level permits inclusion of a low-noise Zener diode. The method, including the Zener diode fabrication, includes the following steps:

(1) Begin with a <100> oriented monocrystalline silicon wafer of p-type with resistivity in the range of 8 to 15 ohm-cm and with oxygen concentration in the range of 30 to 36 parts per million. This level of oxygen exceeds the room temperature solid solubility limit, and the heat treatments of steps (2) and (11) initiate deep defects sites and precipitate oxygen in the interior of the silicon wafer. Later processing steps will grow these initial deep defects into major dislocations and will also drive oxygen from the surface leaving a denuded surface zone. The dislocations and precipitated oxygen will getter various impurities such as iron and copper introduced in subsequent processing steps, and the denuded zone provides low defect silicon for device fabrication. These internal defects decrease the lifetimes and diffusion lengths of minority carriers deep in the substrate.

(2) Thermally grows a silicon dioxide ("oxide") layer of thickness 5300 Å on the surface of the silicon wafer. Steam oxidation (about one hour at 1050° C.) provides quicker oxidation than dry oxidation (more than 10 hours at 1100° C.). Indeed, growth in oxygen for two hours at 750° C. will stabilize microclusters of oxygen precipitates and a subsequent growth in steam for one hour at 1050° C. will generate interstitial silicon which helps dissolve oxygen near the wafer surface to form a denuded zone for device fabrication.

(3) Spin a layer of photoresist onto the oxide coated wafer, and expose and develop a pattern in the photoresist defining all needed N+ buried layers. Both types of NPN devices (regular and high beta) and both types of PMOS devices (digital and analog) plus poly-to-poly capacitors and NiCr resistor areas will all be situated over N+ buried layers.

(4) Use the patterned photoresist as a mask to wet etch the exposed underlying oxide with buffered HF.

(5) Strip the patterned photoresist with piranha (a sulfuric acid, hydrogen peroxide solution). This leaves the oxide coated silicon wafer with openings in the oxide layer at the locations of eventual buried N+ layers.

(6) Implant arsenic ions at an energy of 80 KeV and a dose of $3\times10^{15}$ ions/cm$^2$ using the patterned oxide as an implant mask. The projected range for arsenic ions at 80 KeV is about 400–500 Å in both silicon and oxide, so the arsenic ions do not penetrate the oxide and only enter the silicon through the openings defining the N+ buried layers.

(7) Spin another layer of photoresist onto the oxide coated wafer, and expose and develop a pattern in the photoresist defining all needed N– buried layers. Both digital NMOS and PMOS devices plus isolated PNP devices and Zener diodes will all be located over N– buried layers. This layer of photoresist will cover all of the openings in the underlying oxide through which the arsenic was implanted in step (6) except in the locations of digital PMOS devices where the opening in the oxide will again be exposed. Additionally, the oxide in the N– buried layer locations will be exposed. Note that only a single oxide is being used for both N+ and N– buried layer location definition; this avoids oxide strip and regrowth steps.

(8) Use the patterned photoresist as a mask to wet etch the exposed underlying oxide with buffered HF. Buffered HF etches oxide much faster than silicon, so the exposed silicon in the digital PMOS locations will not be significantly etched.

(9) Implant phosphorus ions at an energy of 120 KeV and a dose of $2\times10^{13}$ ions/cm$^2$ with the patterned photoresist as the implant mask. The projected range of phosphorus at 120 KeV in photoresist is about 2000 Å and in silicon about 1400 Å; thus the photoresist can effectively mask the phosphorus even over the locations of oxide openings from step (4). Note that the phosphorus (peak 1400 Å) is much deeper than the previously implanted arsenic (peak 500 Å) in the locations for digital PMOS devices.

(10) Strip the patterned photoresist with piranha. This leaves the oxide coat with openings from both steps (4) and (8).

(11) Anneal the oxide coated wafer in an oxidizing atmosphere to both grow 2300 Å of oxide on exposed silicon (and further increase the thickness of the existing oxide coat elsewhere) and drive in the implanted arsenic and phosphorus. The oxide grows faster on the exposed silicon, so when the oxide is removed in step (13) a faint pattern of the N+ locations will appear on silicon surface. The phosphorus diffuses faster than the arsenic, and the resulting N+ arsenic doped regions extend down about 3 micrometers ($\mu$m) from the wafer surface and the N– phosphorus doped regions extend down about 7 $\mu$m. Note that a single drive in diffusion for both the arsenic and the phosphorus saves significant overall processing time in comparison with separate drive ins of the arsenic and phosphorus. The oxide growth plus drive in may be performed as follows: first, use a nitrogen atmosphere (with a little oxygen to prevent silicon nitride formation) at 750° C. for about three hours to condense oxygen nucleation in bulk so unstable microclusters grow into more stable precipitate centers which later attract more oxygen and lead to large defects. Second, again in a nitrogen atmosphere with a little oxygen at 1200° C. for about three and two thirds hours, drive in the buried layer implants, denude the surface, and grow bulk defects. Lastly, in an oxygen atmosphere at 950° C. for one half hour, grow the majority of the oxide.

Figure 3:
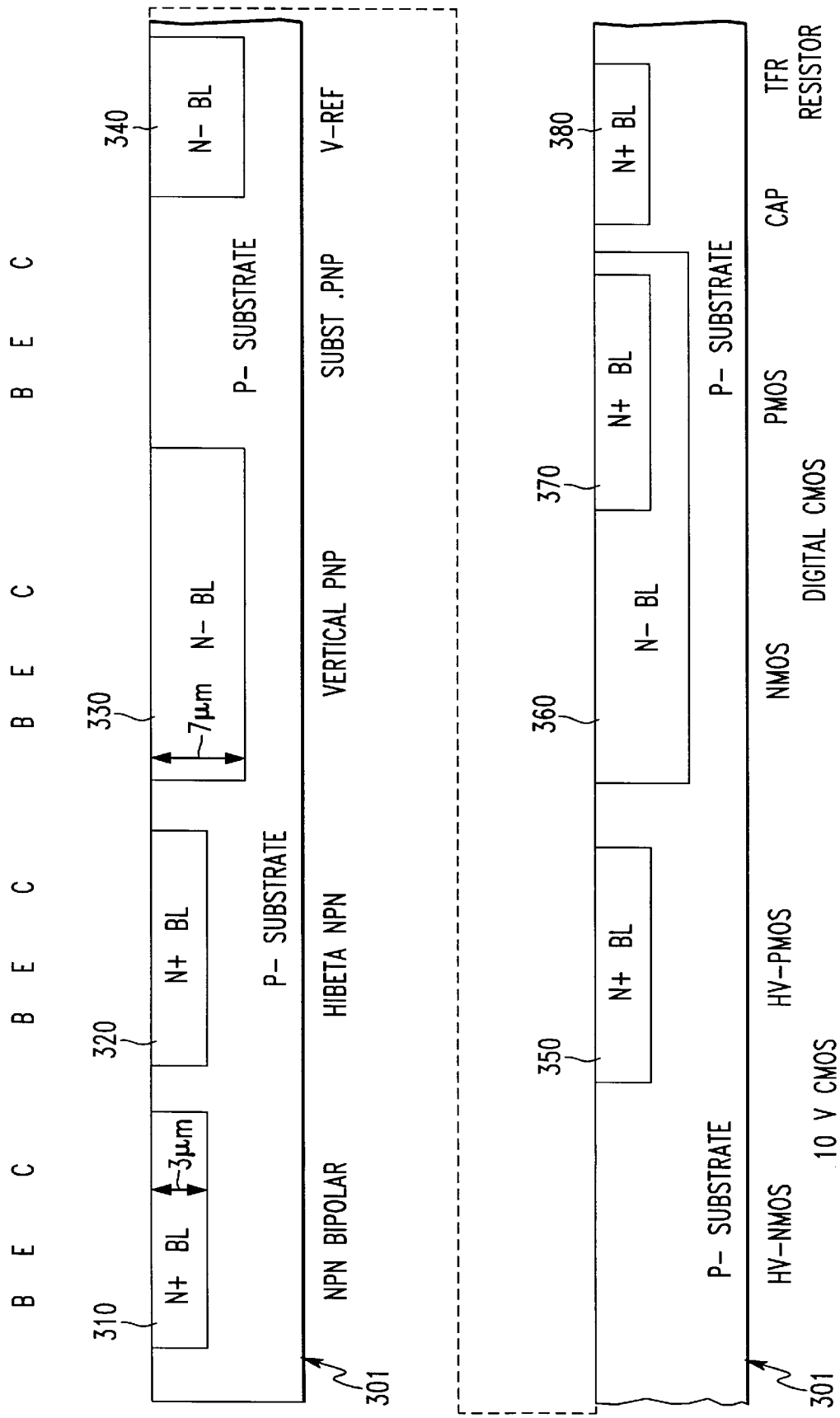
FIGS. 3–23 are cross-sectional elevation views of steps of a preferred embodiment method of fabrication.

(12) Strip the oxide with buffered HF. FIG. 3 illustrates the resulting regions in wafer 301 for representative devices as follows: 310 and 320 will be N+ buried layers for NPN and high beta NPN devices, respectively, 330 will be an N– buried layer for an isolated vertical PNP, a substrate PNP does not need the buried layer, 340 will be an N– buried layer for a Zener diode, a high voltage NMOS device does not need a buried layer, 350 will be the N+ buried layer for a high voltage PMOS device, 360 is a buried N– layer for the digital NMOS and PMOS with 370 the N+ buried layer for the digital PMOS, and 380 will be an N+ buried layer for a poly-to-poly capacitor and for a NiCr resistor. The buried N– layer 360 will form a pseudo-substrate for the digital CMOS: wafer 301 will be biased at – 5 volts and the analog devices (bipolar and high voltage CMOS) will operate between power rails at + 5 volts and – 5 volts, whereas the digital CMOS will operate between the usual 0 and + 5 volts. Thus the digital CMOS needs isolation from the portion of wafer 301 at – 5 volts. Buried layer 360 biased at + 5 volts (usual CMOS bias for N substrate) provides this isolation by forming a reversed biased junction with the remainder of wafer 301. Hence, switching noise electrons generated by the digital CMOS will be contained in N-layer 360 and away from the analog devices by the 10-volt barrier at the junction with the P-wafer at – 5 volts.

(13) Spin a 1.5 $\mu$m thick layer of photoresist onto bare wafer 301, and expose and develop a pattern in the photoresist defining all needed P+ buried layers and also P+ channel stops. The buried P+ locations may be aligned to the pattern of the N+ buried layer locations. Both isolated and substrate PNP devices, Zener diodes, and both high voltage and digital NMOS devices will all be located over P+ buried layers.

Figure 4:
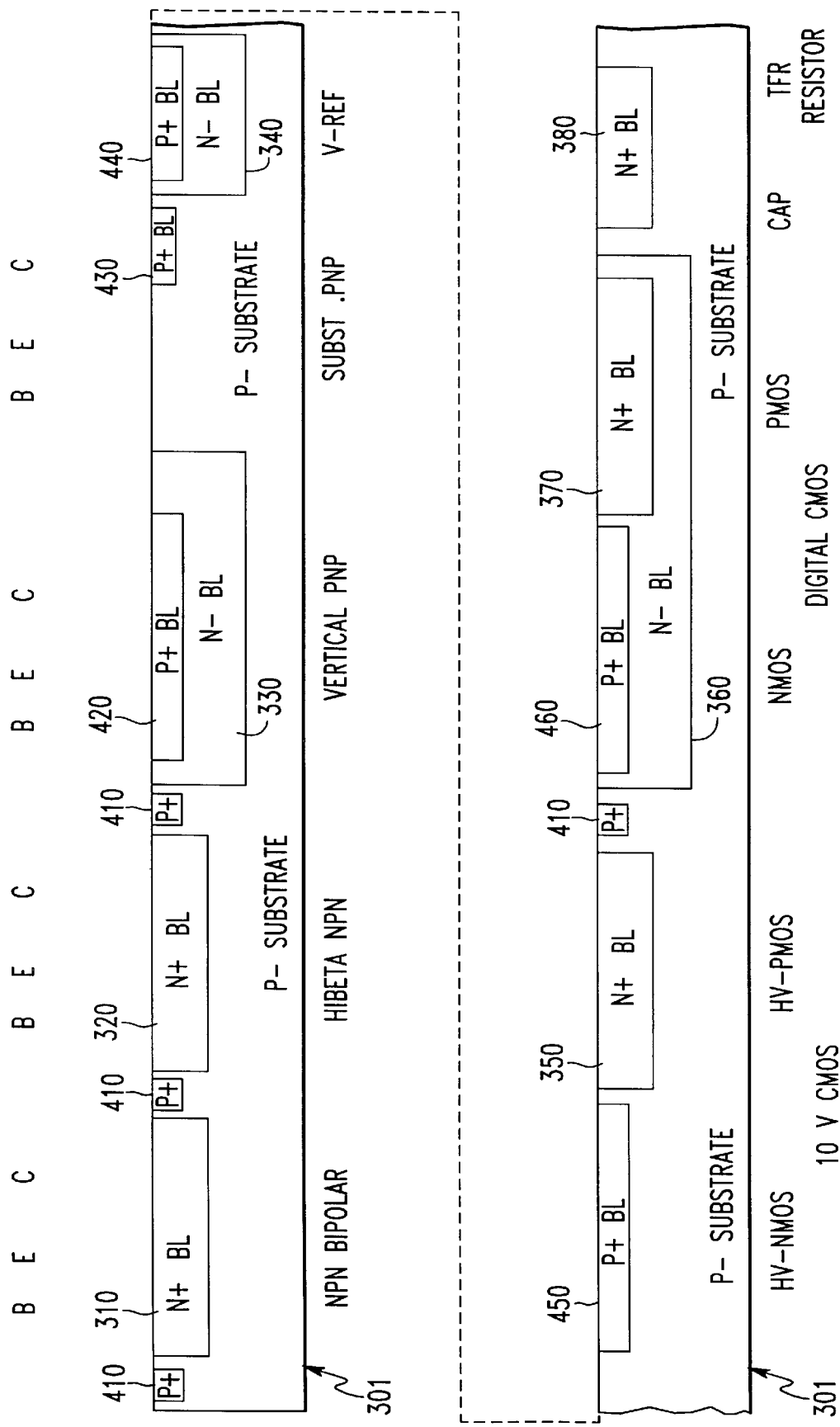

(14) Implant boron ions at an energy of 120 KeV and does of $1 \times 10^{14}$ ions/cm$^2$ using the patterned photoresist as the implant mask. The boron has a projected range of about 3500 Å in silicon and 5000 Å in photoresist. Strip the photoresist with piranha; FIG. 4 shows the resulting cross section with representative device locations. In particular, P+ buried channel stop regions 410 will eventually be under recessed isolation oxide regions, P+ buried layer 420 will be the subcollector for the isolated vertical PNP device, P+ buried layer 430 will be part of the surface collector contact for the substrate PNP device, P+ buried layer 440 will be part of the anode structure of the Zener diode, and P+ buried layers 450 and 460 will underlie the high voltage analog and digital NMOS devices, respectively. Note that P+ buried layers 420, 440, and 460 lie completely within N– buried layers 330, 340, and 360, respectively, which act as pseudo N– substrates. Later oxide isolation makes this structure essentially become an N– substrate on P-wafer 301 and yields isolated circuits and true complementary devices from a triple buried layer structure. The implanted boron will be driven in to a depth of about 2.5 $\mu$m during the epitaxial deposition of step (15), so there is no separate drive in anneal.

Figure 5:
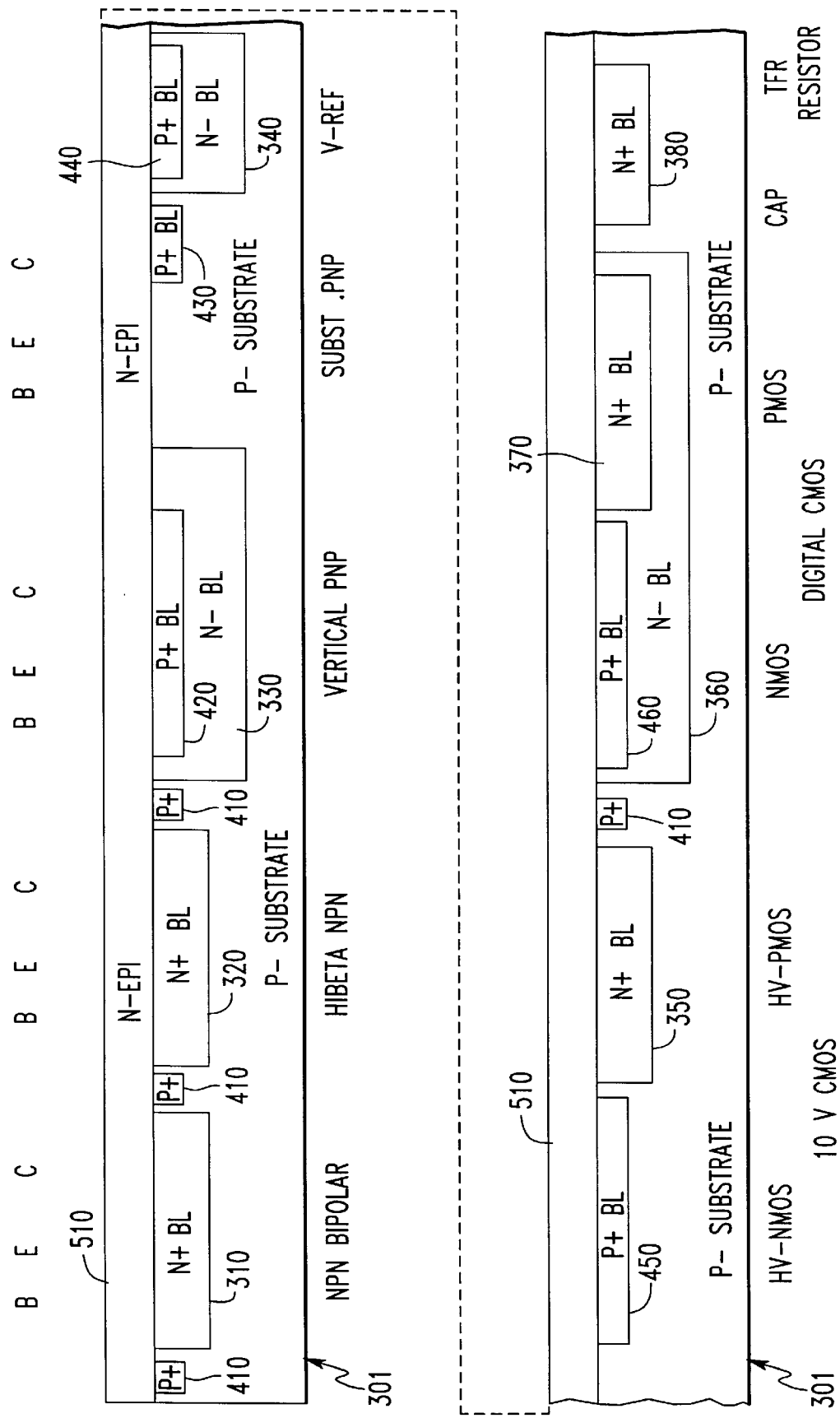

(15) Etchback about 2000 Å of implanted wafer 301 in HCl at 1175° C. (2 minutes) in preparation for epitaxial deposition; this etchback must be limited to avoid removing a significant amount of the implanted boron. Epitaxially deposit in situ arsenic-doped silicon layer 510 of thickness 1.7 $\mu$m onto implanted wafer 301 by thermal decomposition (~1060° C.) of dichlorsilane plus arsine. The arsenic doping level is set to yield a resistivity of 0.8 ohm-cm (roughly $8 \times 10^{15}$ atoms/cm$^3$) for layer 510. This combination of thickness and resistivity provides the correct performance of the NPN devices in terms of breakdown and Early voltages plus also permits counter doping to provide P wells in the epilayer 510. The P wells need to be generated with a very low thermal budget, so epilayer 510 must be thin. The epitaxial deposition temperature also drives in the boron implanted in step (14). FIG. 5 illustrates the epilayer 510 on wafer 301. Further, the avoidance of drive ins (low thermal budget) and a shallow emitter permit such a thin epilayer due to the lessening of dopants diffusing up from the buried layers (subcollectors) to narrow the active collectors. Indeed, the epilayer thickness and doping relate to Early voltage and emitter-collector breakdown so that the following can be achieved for the NPN devices:

| Operating Voltage | Epi Deposition Thickness | Epi Doping/ cm$^3$ | BV$_{eco}$ | Early Voltage | β |
|---|---|---|---|---|---|
| 10 V | 1.5–1.8 $\mu$m | $5 \times 10^{15}$– $1 \times 10^{16}$ | 11–13 V | 35–55 V | 90–150 |
| 20 V | 2.2–2.8 $\mu$m | $2 \times 10^{15}$– $5 \times 10^{15}$ | 20–24 V | 40–65 V | 90–150 |

The specific details below are for the 10-volt process. Note that the product of beta times early-voltage is at least 5000, and about 6000 is typically achieved.

(16) Thermally grow a pad oxide of thickness 625 Å on epilayer 510 in steam at approximately 900° C.; this consumes about 300 Å of epilayer 510. This pad oxide will provide stress relief for the silicon nitride ("nitride") oxidation mask during the subsequent recessed local oxidation of the silicon (LOCOS) to create recessed isolation oxide regions.

(17) Deposit by LPCVD a 1200 Å thick layer of nitride on the pad oxide.

(18) Spin a 1.5 $\mu$m thick layer of photoresist onto the nitride/oxide coated wafer 301, and expose and develop a pattern in the photoresist defining all recessed isolation oxide locations.

(19) Plasma etch the nitride, pad oxide, plus underlying silicon using the patterned photoresist as the etch mask. The nitride and pad oxide are relatively thin, so an isotropic etch would suffice for the initial stages of the plasma etch, and a mixture of SF$_6$ and O$_2$ gives a relatively anisotropic etch of the silicon. Etch about half way through epilayer 510, that is, to a depth of about 0.65–0.7 $\mu$m.

(20) Strip the photoresist with piranha. This leaves trenches in wafer 301 with the patterned nitride and pad oxide coating the tops of the mesas between the trenches.

(21) Oxidize the exposed silicon trenches in an oxygen atmosphere at 975° C. and a pressure of 25 atmospheres for 25 minutes to grow oxide to a thickness of 1.5–1.7 $\mu$m. The nitride protects the mesa tops from oxidation, but oxide grows laterally under the edges of the nitride to form "bird's head" bulges which will be eliminated in step (22). In the trenches the oxidation consumes the remaining vertical portion of epilayer 510 and reaches to buried P+ channel stop regions 410 or the P+ buried layers 420, 430, 440, 450, and 460 and the N+ buried layers 310, 320, 350, 370, and 380. Note that the relatively thin epilayer 510 permits the oxidation to consume the epilayer in the trenches without creating excessive bird's head or overrunning a low thermal budget. Also, the thin epilayer 510 permits narrow recessed isolation oxide regions for close packing of devices, especially among the NPN devices which need isolated collectors. The isolation oxide extends above the silicon surface and this permits later planarization to avoid touching the mesa silicon. This also permits pad oxide overetch in step (31) to remove the "bird's beak" without recessing the isolation oxide top; consequently, the gate width of MOS devices increases. Note that the deposited epilayer thickness was about 1.7 μm but up diffusion of the buried layers decreases this to about 1.3 μm if the edge of the buried layer is taken to be where the dopant concentration exceeds the original epilayer concentration by a factor of 10; that is, about $1 \times 10^{17}$. The isolation oxide grows down to overlap the buried layers and thereby perform its isolation function.

(22) Spin on planarizing photoresist to a thickness of 1.5 μm; the photoresist covers the irregular surface created by the oxidation of step (21) but has an essentially planar top surface. Etch back the photoresist plus the bird's head oxide bulges with a plasma etch of $CHF_3$ and $O_2$. This removes all of the photoresist and approximately planarizes the surface.

Figure 6:
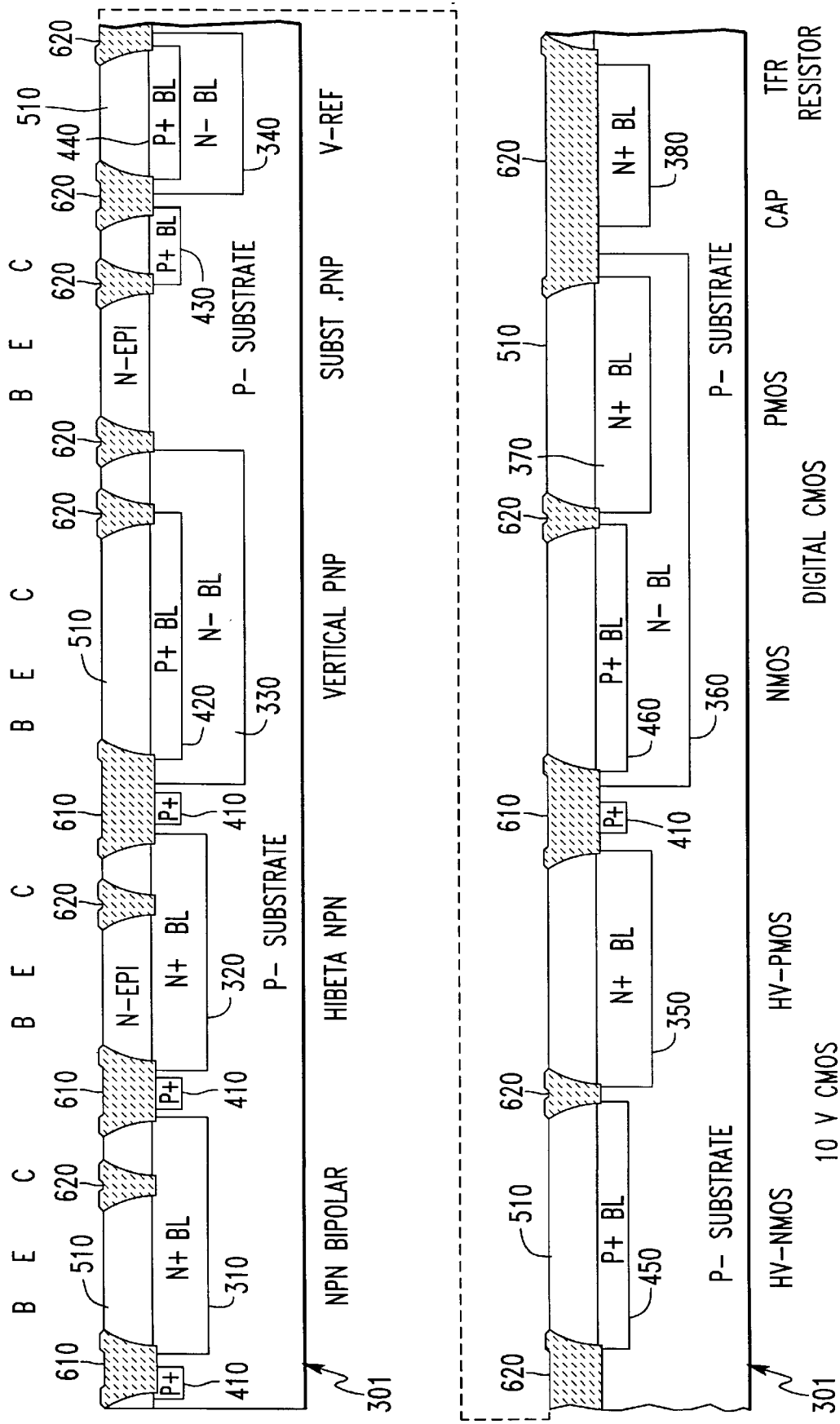

(23) Strip the nitride with hot $H_3PO_4$. FIG. 6 shows the resulting structures in wafer 301 with the recessed isolation oxide regions 610 and 620; the pad oxide is too thin to show on the drawings but remains as a deterrent to channeling in the implants of steps (25), (26), (29), (30), and (33). The 610 isolation regions have underlying P+ channel stop buried regions and separate two N type buried layers.

(24) Spin a 1.5 μm thick layer of photoresist onto wafer 301, and expose and develop a pattern in the photoresist defining the N wells needed for both analog and digital PMOS devices. (N-well is primarily just epilayer 510; this step is for surface doping to form the buried channel of proper $V_{tp}$.)

(25) Implant threshold adjusting boron ions at 30 KeV and a dose of $2.3 \times 10^{12}$ ions/$cm^2$ using the patterned photoresist from step (24) as the implant mask. This boron dose will set the PMOS device threshold voltages to about − 1.0 volt. Note that the projected range for 30 KeV boron ions is about 1000 Å in silicon.

(26) Implant N well phosphorus ions at 160 KeV and a dose of $1.5 \times 10^{12}$ ions/$cm^2$ using the same patterned photoresist as the boron implant of step (25). The projected range of 160 KeV phosphorus is about 2200 Å; thus the phosphorus implant lies beneath the boron threshold adjustment implant but the phosphorus implant remains close to the surface. Recall that epilayer 510 had a deposited thickness of about 1.7 μm thick and an arsenic concentration of about $8 \times 10^{15}$ atoms/$cm^3$, but over the N+ buried layers the epilayer 510 deposition itself and other heat treatments caused updiffusion so the effective epilayer thickness is about 1.2 μm. After the boron and phosphorus implants, the net donor concentration at a depth of about 2000 Å is $1.5 \times 10^{16}$ atoms/$cm^3$ and at a depth of about 1000 Å the boron has converted the doping to a net acceptor concentration of about at most $1 \times 10^{16}$ atoms/$cm^3$. The PN junction formed at a depth of about 1500 Å has a depletion region extending to the wafer surface, and the PMOS devices will be buried channel type devices. The high voltage PMOS will almost be a surface channel device due to the two gate oxidations, and $V_{tp}$ is fairly high. Indeed, the N wells have an overall retrograde doping (increasing donor concentration with depth) down to the N+ buried layer peak despite the bump from this phosphorus implant, see FIG. 2d. In general, retrograde doping reduces latchup and snapback parasitics by providing high conductivity wells in spite of the low surface doping required for proper MOS thresholds. The buried N+ layers below the N wells further reduces latchup and snapback by providing very high conductivity regions. The well anneal of step (35) will spread out the implants, but the digital PMOS devices will remain buried channel devices and the high voltage analog PMOS devices will be almost surface channel devices.

Figure 7:
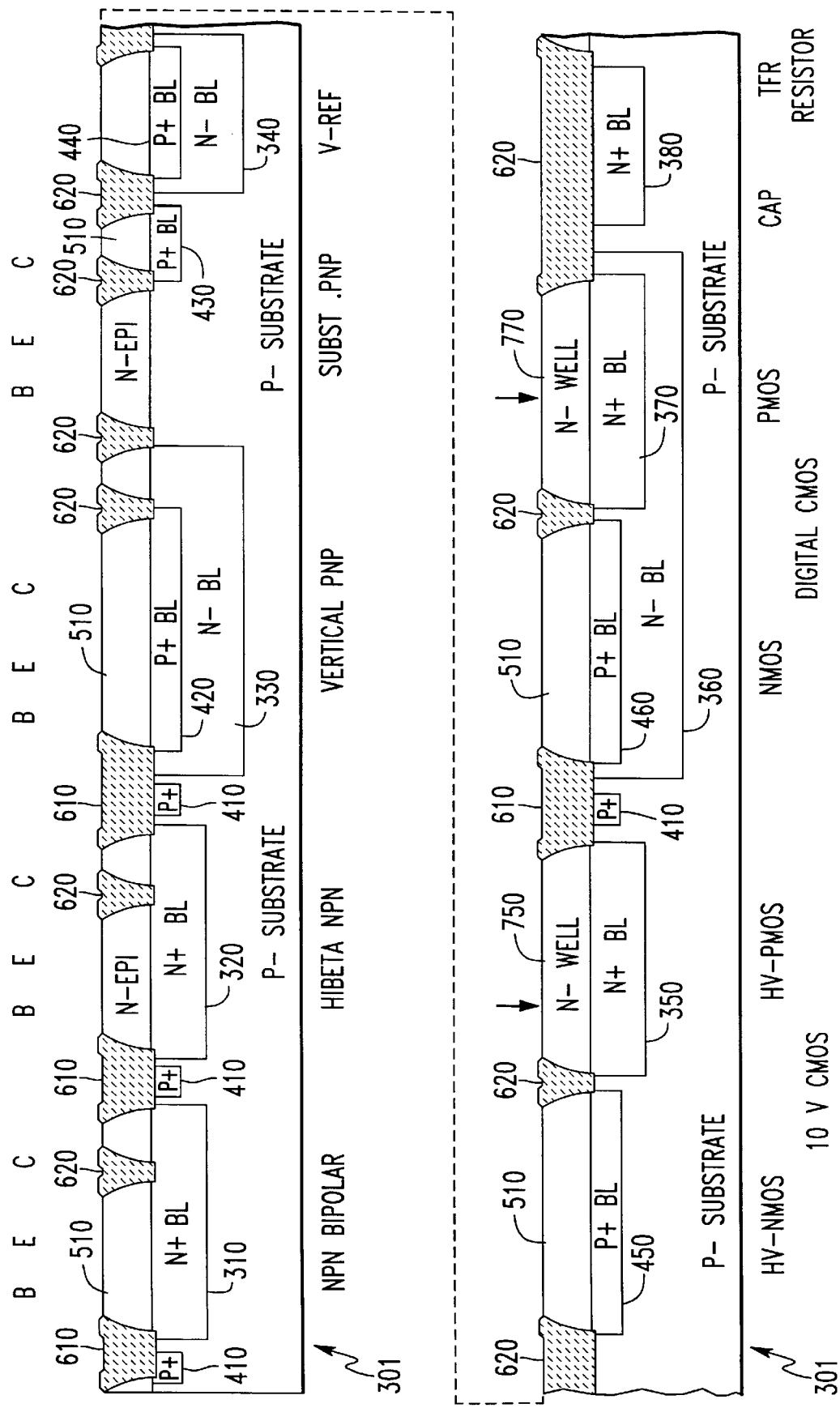

(27) Strip the patterned photoresist with piranha. FIG. 7 shows the resulting structure with N wells 750 for analog PMOS devices and N wells 770 for digital PMOS devices.

(28) Spin a 1.5 μm thick layer of photoresist onto wafer 301, and expose and develop a pattern in the photoresist defining the P wells needed for both analog and digital NMOS devices, the Zener diodes, and also the collector for the isolated PNP and a portion of the collector contact structure for the substrate PNP.

(29) Implant threshold adjusting boron ions at 50 KeV and a dose of $2.8 \times 10^{12}$ ions/$cm^2$ using the patterned photoresist from step (28) as the implant mask. This boron dose will set the NMOS device threshold voltages to about + 0.65 volt. As noted in steps (25)–(26) the projected range for 30 KeV boron ions is about 1000 Å in silicon and the dose suffices to convert the upper 1000 Å of epilayer 510 to P type.

(30) Implant P-well, P double-charged boron ions at 125 KV and a dose of $2.7 \times 10^{12}$ ions/$cm^2$ using the same patterned photoresist as the boron threshold adjustment implant of step (29). The projected range of 250 KeV double-charged boron is about 6500 Å; this dose suffices to convert epilayer 510 to P type despite the original arsenic concentration of about $8 \times 10^{15}$ atoms/$cm^3$. During the well anneal of step (35) boron from P+ buried layers 420, 430, 440, 450, 460 will diffuse slightly upwards and meet the spreading implanted boron to change all of epilayer 510 to P type with the net donor concentration averaging about $4 \times 10^{16}$ atoms/$cm^3$ and peaking at the original implant depth of about 6500 Å. The P wells including P+ buried layers have an effectively retrograde doping, but less drain capacitance than implanted-only retrograde well; see FIGS. 2c and 2e for doping profiles of the completed devices. The buried P+ layers below the P wells further reduces latchup and snapback by providing high conductivity regions. Also, the vertical PNP devices will use this P well as its collector, so the higher doping levels will lessen the resistivity between the P+ subcollector 420 and the collector contact 1826 to be formed later.

Figure 8:
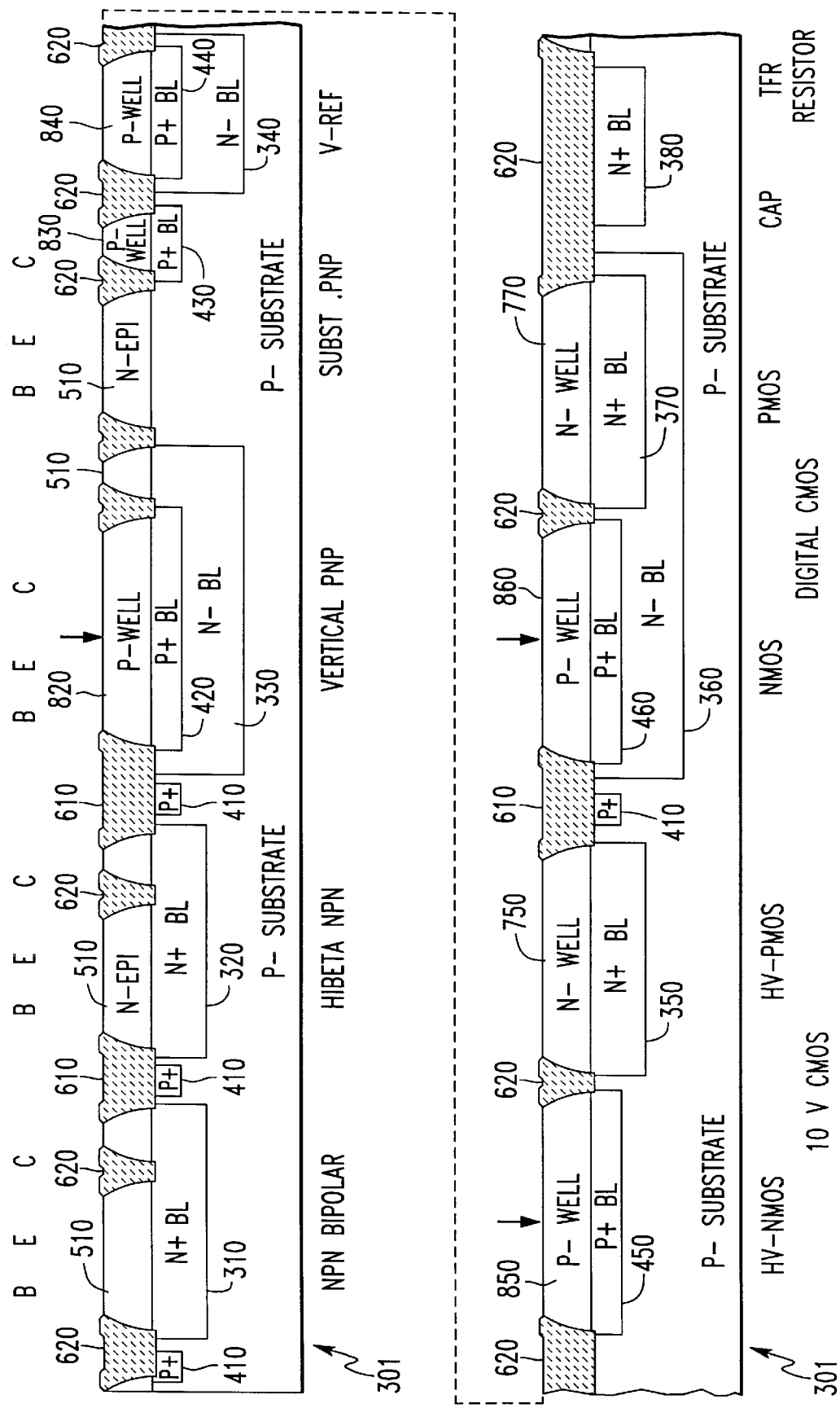

(31) Strip the patterned photoresist with piranha. FIG. 8 illustrates the P collector 820 of the isolated PNP, the collector contact portion 830 of substrate PNP, P well 840 for the Zener diodes, and P wells 850 and 860 of analog and digital NMOS devices, respectively.

(32) Spin a 1.5 μm thick layer of photoresist onto wafer 301, and expose and develop a pattern in the photoresist defining the Zener diode location.

(33) Implant boron ions at 160 KeV and a dose of $1.2 \times 10^{14}$ ions/$cm^2$ using the patterned photoresist from step (32) as the implant mask. The projected range of 160 KeV boron is about 4500 Å. The boron dose suffices to convert the central portion of epilayer 510 to P type with a doping concentration of roughly $1 \times 10^{18}$ atoms/$cm^3$. FIG. 2h shows the doping profile for the completed Zener diode.

Figure 9:
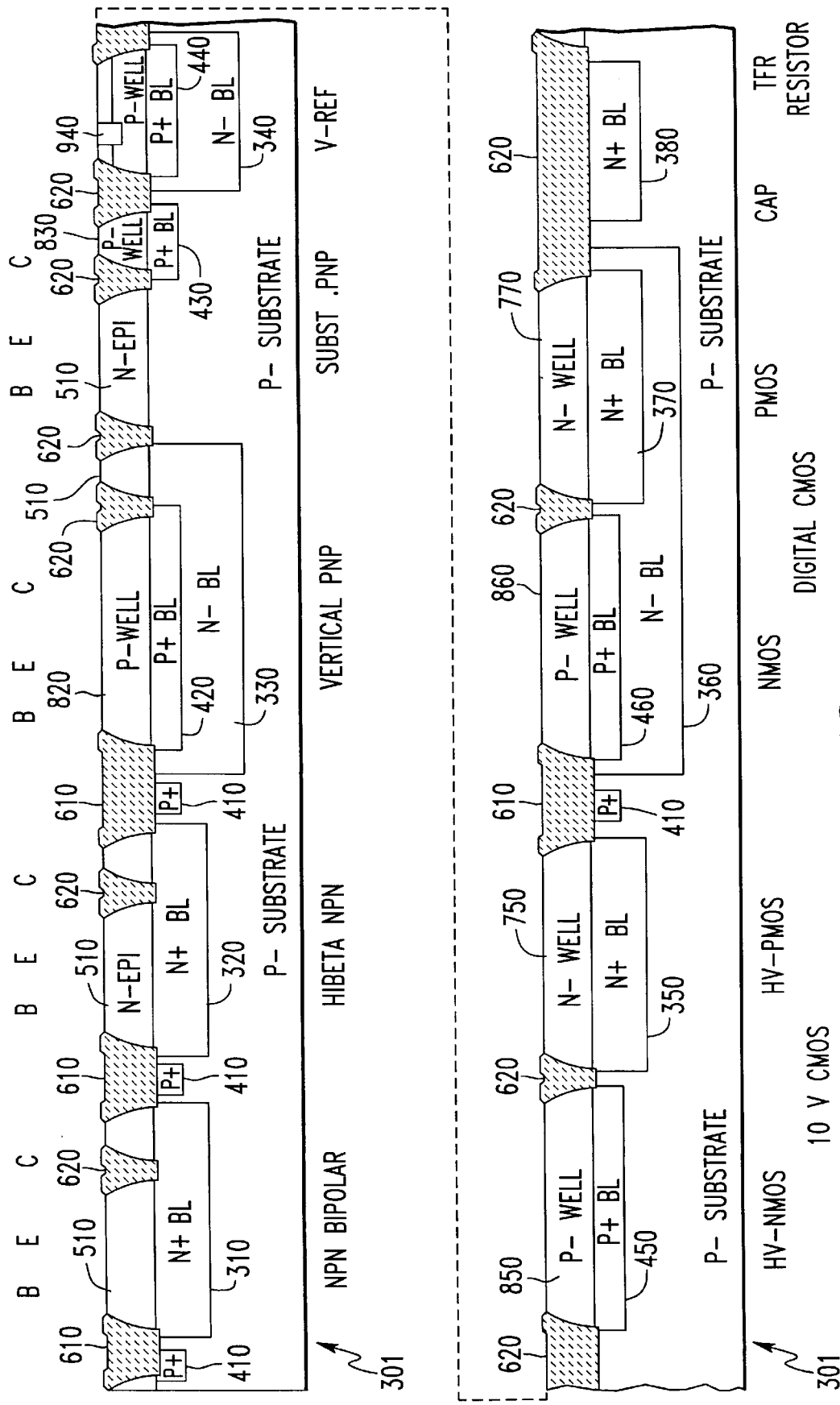

(34) Strip the patterned photoresist with piranha; FIG. 9 shows the resulting converted portion 940 of epilayer 510 for the Zener diode.

(35) Anneal wafer 301 in a nitrogen atmosphere for 30 minutes at 975° C. This activates the implanted dopants and causes some diffusion, especially of the boron.

(36) Strip the pad oxide with an HF etch plus overetch to remove most of the bird's-beak from the oxidation of step (21). This effectively increases the width of the silicon mesas between the isolation oxides. After a cleanup, thermally grow 185 Å thick gate oxide on the exposed silicon of wafer 301 in a dry oxygen atmosphere at 920° C.; of course, the isolation oxides 610 and 620 also increase slightly in thickness.

(37) Deposit 5500 Å thick undoped polysilicon on the oxidized wafer 301 with LPCVD by silane decomposition.

(38) Spin a 1.5 μm thick layer of photoresist onto the polysilicon covered wafer and expose and develop a pattern in the photoresist defining the deep N+ contacts to N+ buried layers 310 and 320 and N– buried layer 330. Recessed isolation oxide surrounds these deep N+ contact locations, so the contacts will self-align with large photoresist openings.

Figure 10:
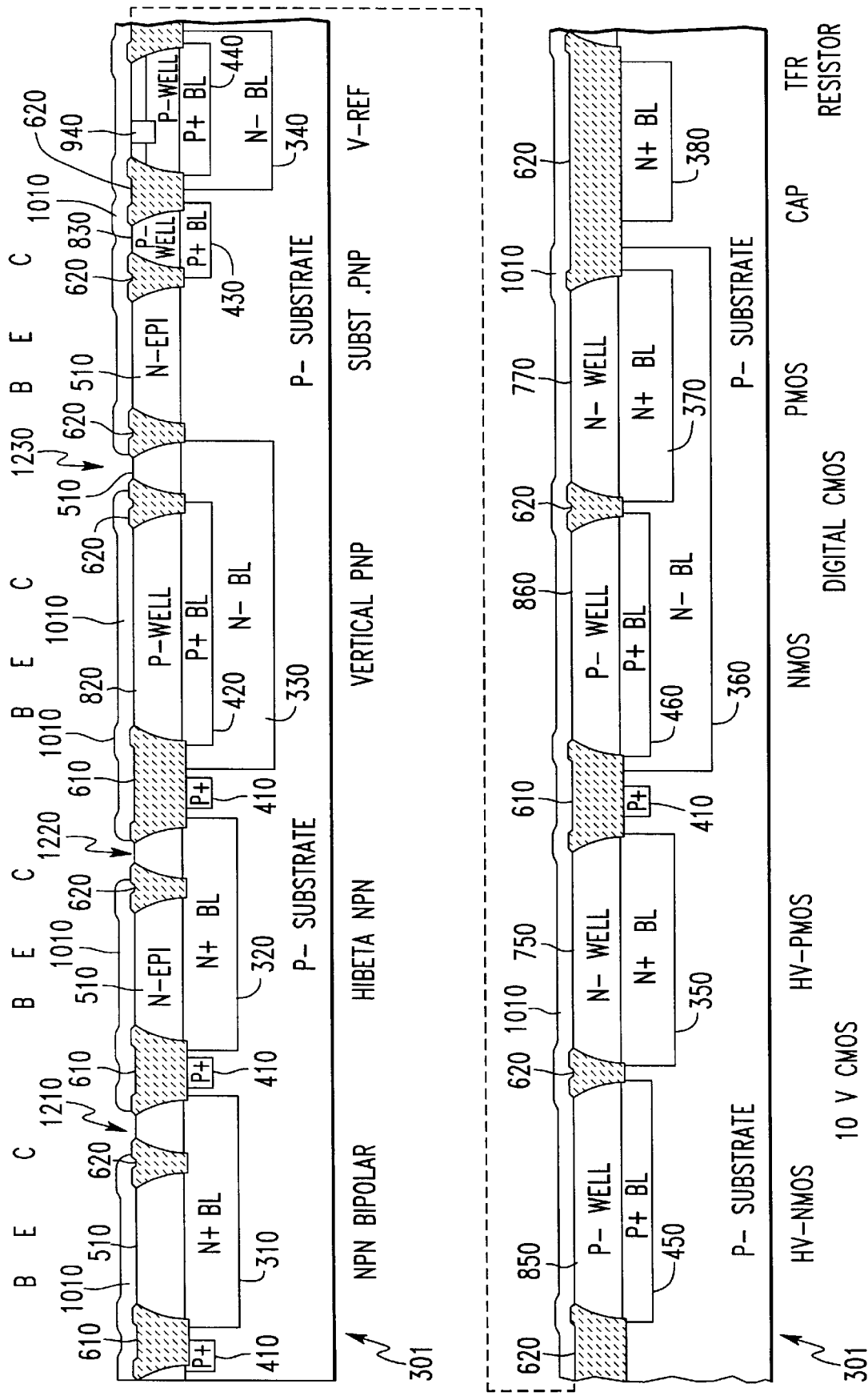

(39) Plasma etch openings in the layer of undoped polysilicon with $SF_6$ and $O_2$ using the patterned photoresist as an etch mask. This etch selective etches polysilicon and effectively stops on the 185 Å oxide; see FIG. 10 showing polysilicon 1010.

(40) Strip the patterned photoresist with piranha.

(41) Wet etch (HF) the 185 Å oxide exposed by the openings in undoped polysilicon layer 1010 formed in step (39). That is, apertured polysilicon 1010 forms the etch mask, so the exposed portions of recessed isolation oxide will also be etched, but only a few hundred Å will be lost. FIG. 10 shows the openings 1210, 1220, and 1230 through both polysilicon layer 1010 and the 185 Å oxide.

(42) Dope apertured polysilicon 1010 and the silicon exposed through openings 1210, 1220, and 1230 with phosphorus by decomposing $POCl_3$ on the surface at 890° C. The resulting resistivity of the doped polysilicon is about 11 ohms/square, and the upper portion of the exposed silicon dopes to N+ . The deep N+ contact regions have a carrier concentration of greater than $1 \times 10^{20}/cm^3$. This doping of both the polysilicon layer and the deep N+ contact regions with the same step eliminates a separate diffusion or implant.

(43) Spin a 1.5 μm thick layer of photoresist onto apertured-polysilicon coated wafer 301, and expose and develop a pattern in the photoresist defining the digital NMOS and PMOS device gates and interconnection lines plus the bottom plates of the poly-to-poly capacitors plus covering the exposed silicon in openings 1210, 1220, and 1230. Because openings 1210, 1220, and 1230 were larger than the portions of wafer 301 doped, the photoresist can be smaller than the openings and thereby not cover any of the adjacent polysilicon. The gates may have nominal lengths of 1.4 μm as drawn but effective lengths of 0.9 μm.

(44) Plasma etch the polysilicon with $SF_6$ and $O_2$ or HBr and $Cl_2$ using the patterned photoresist as an etch mask. This etch selective etches polysilicon and effectively stops on oxide, so an overetch to guarantee removal of polysilicon will also not etch significantly down into wafer 301.

(45) Strip the patterned photoresist with piranha, and strip the exposed gate oxide with HF leaving just gate oxide 1110 under the gates 1160 and 1170 and the lower capacitor plate 1180 formed from polysilicon 1010 in step (44).

Figure 11:
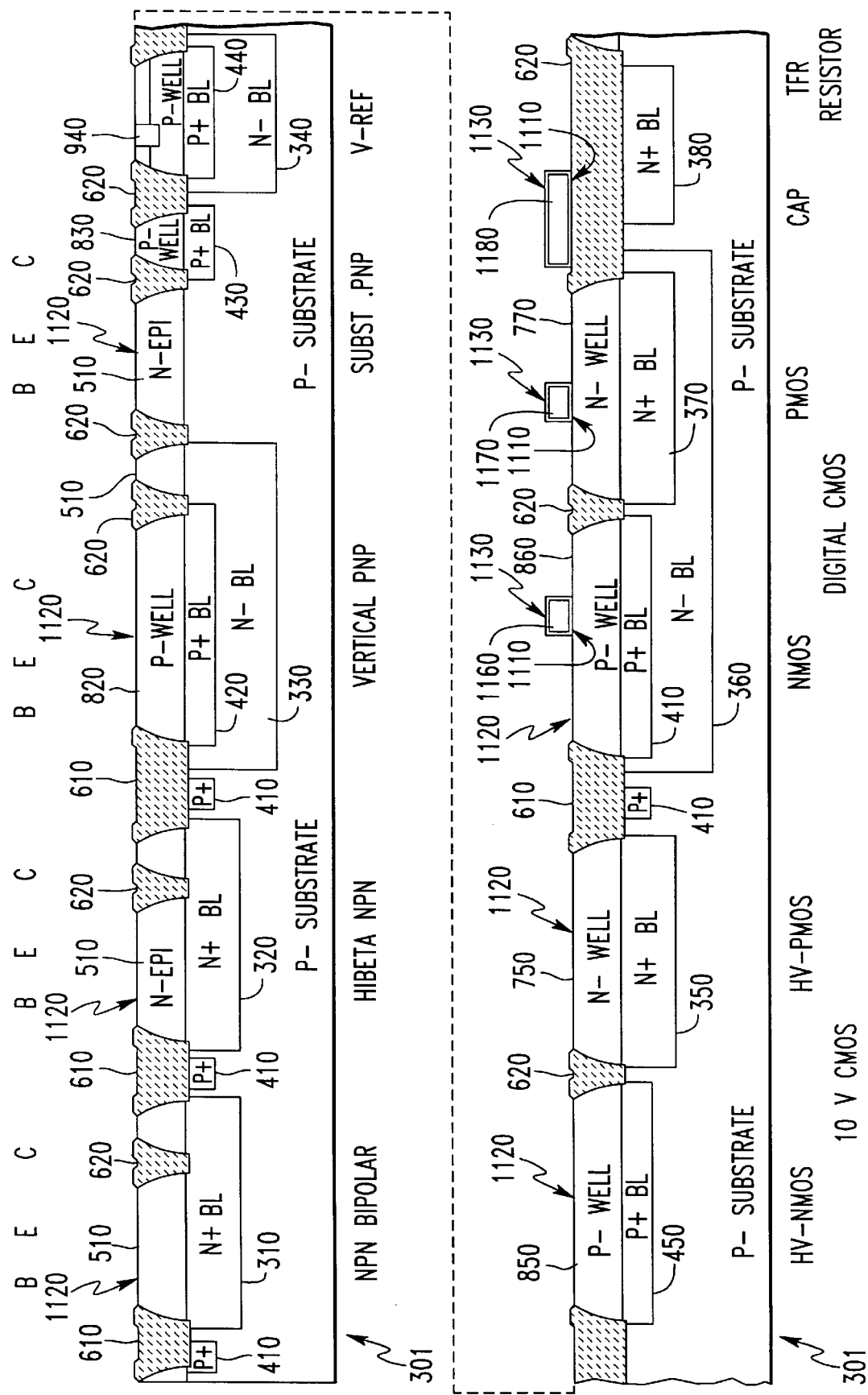

(46) Thermally oxidize patterned-polysilicon-coated wafer 301 in an oxygen atmosphere at 920° C. to grow a second gate oxide of thickness 300 Å on the exposed silicon. Note that the exposed surfaces of the patterned doped polysilicon from step (44) oxidize much more rapidly than the silicon of wafer 301 due to the heavy doping of the polysilicon, and an oxide of thickness 900 Å forms on the polysilicon. FIG. 11 illustrates the resulting structure on wafer 301 including 185 Å first gate oxide 1110 under digital NMOS and PMOS gates 1160 and 1170, respectively, 300 Å second gate oxide 1120 on the wafer surface, and 900 Å oxide 1130 on the surface of polysilicon gates 1160 and 1170 and polysilicon lower plate 1180 of the poly-to-poly capacitor.

Figure 12:
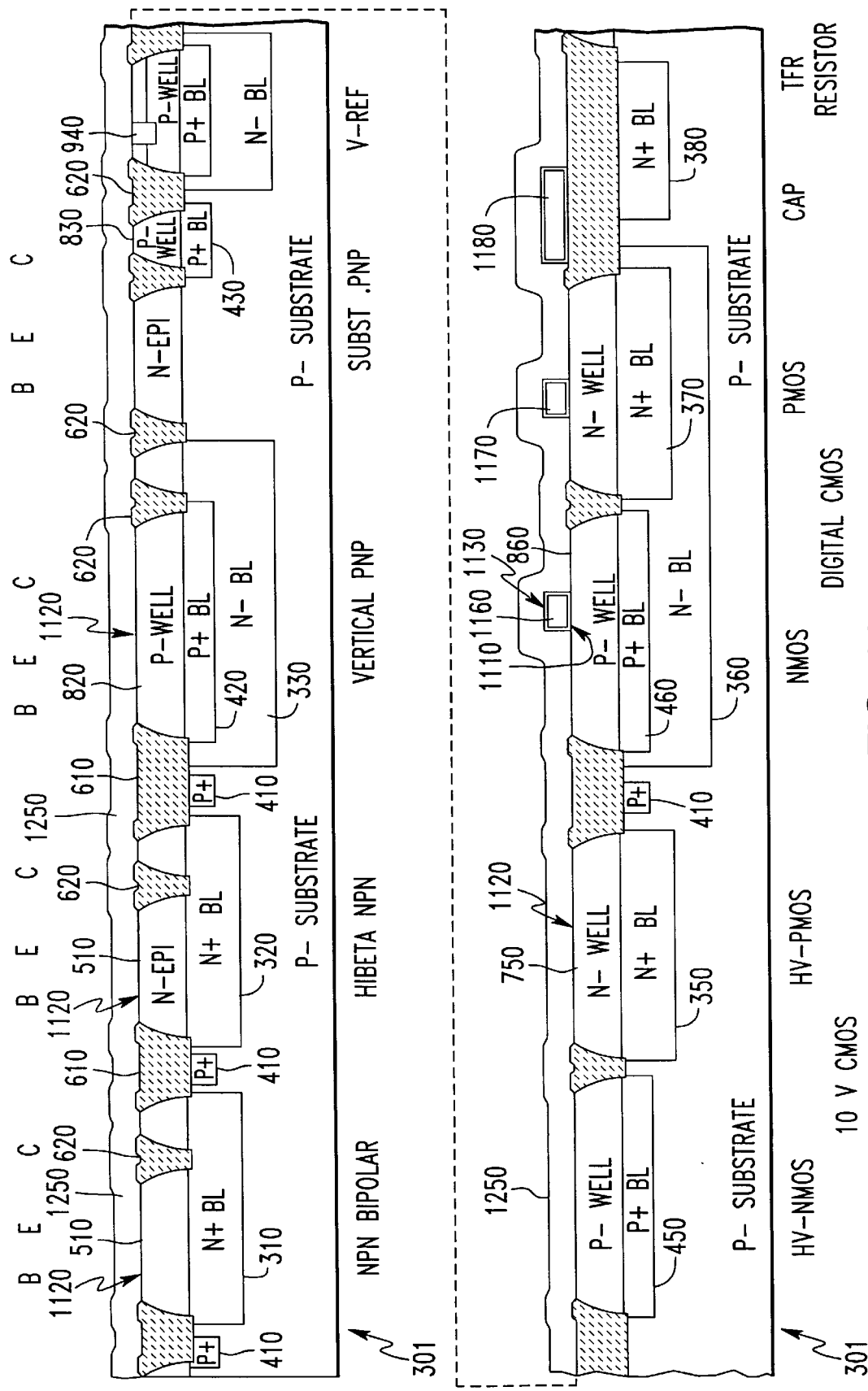

(47) Deposit a second layer of 5500 Å thick undoped polysilicon on coated wafer 301 with LPCVD using silane decomposition. See FIG. 12 showing second polysilicon layer 1250. Note that steps (38)–(41) could have been omitted above and inserted here using polysilicon 1250 in place of polysilicon 1010.

(48) Dope second polysilicon layer 1250 with phosphorus by decomposing $POCl_3$ at 890° C. The resulting resistivity of the doped polysilicon is about 11 ohms/square.

(49) Spin a 1.5 μm thick layer of photoresist onto coated wafer 301, and expose and develop a pattern in the photoresist defining the analog NMOS and PMOS device gates and interconnection lines plus the top plates of the poly-to-poly capacitors. The gates have nominal lengths of 2.0 μm.

(50) Plasma etch the polysilicon with $SF_6$ and $O_2$ or HBr and $Cl_2$ using the patterned photoresist as an etch mask. This selectively etches polysilicon and effectively stops on oxide, so an overetch to guarantee removal polysilicon will also not etch significantly down into wafer 301; however, the 300 Å second gate oxide 1120 not protected by the patterned photoresist plus polysilicon will be partially removed, and the 900 Å oxide 1130 on first polysilicon will be slightly thinned.

Figure 13:
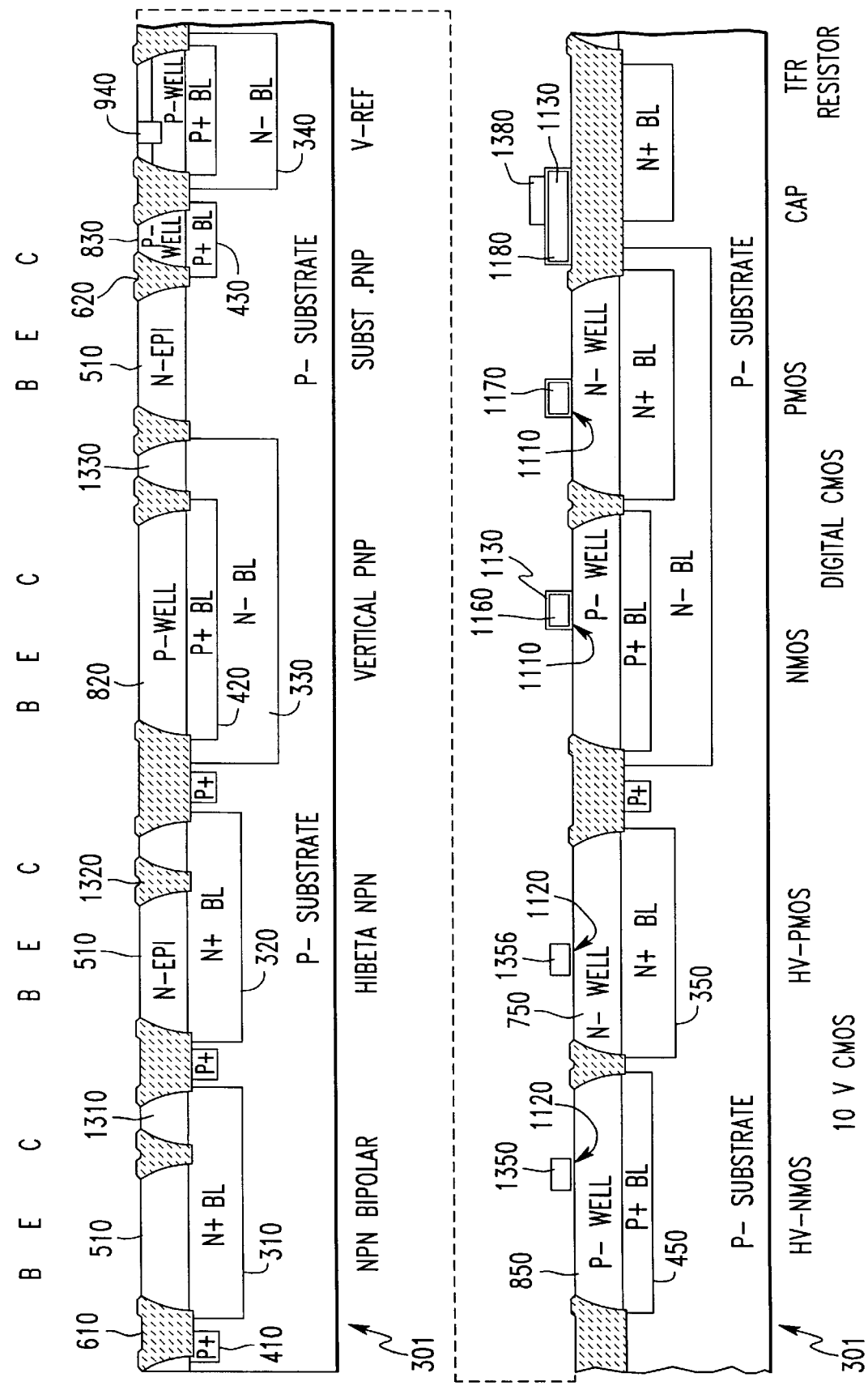

(51) Strip the patterned photoresist with piranha. FIG. 13 shows the resulting analog NMOS and PMOS gates 1350 and 1356, respectively, on 300 Å second gate oxide 1120 and poly-to-poly capacitor with top plate 1380 separated from lower plate 1180 by 900 Å oxide 1130. FIG. 13 also shows deep N+ contacts 1310, 1320, and 1330 that were formed in step (42). If steps (38)–(41) had been moved to follow step (47), then the doping of step (48) would form deep N+ contacts 1310, 1320, and 1330.

(52) Spin a 1.5 μm thick layer of photoresist onto coated wafer 301, and expose and develop a pattern in the photoresist defining the base locations for the isolated PNP devices and also the lightly doped drain extensions of the analog NMOS devices.

(53) Implant phosphorus ions at 160 KeV and a dose of $5.0 \times 10^{13}$ ions/cm² using the patterned photoresist from step (52) as the implant mask. The projected range of 160 KeV phosphorus is about 2200 Å. The phosphorus dose suffices to convert the upper portion of P well 820 to N type with a doping concentration of roughly $2 \times 10^{18}$ atoms/cm³. Recall that P well 820 has retrograde boron doping, so the remaining P type lower portion of P well 820, which will form the active collector of the isolated PNP, will have retrograde doping.

(54) Strip the patterned photoresist with piranha.

Figure 14:
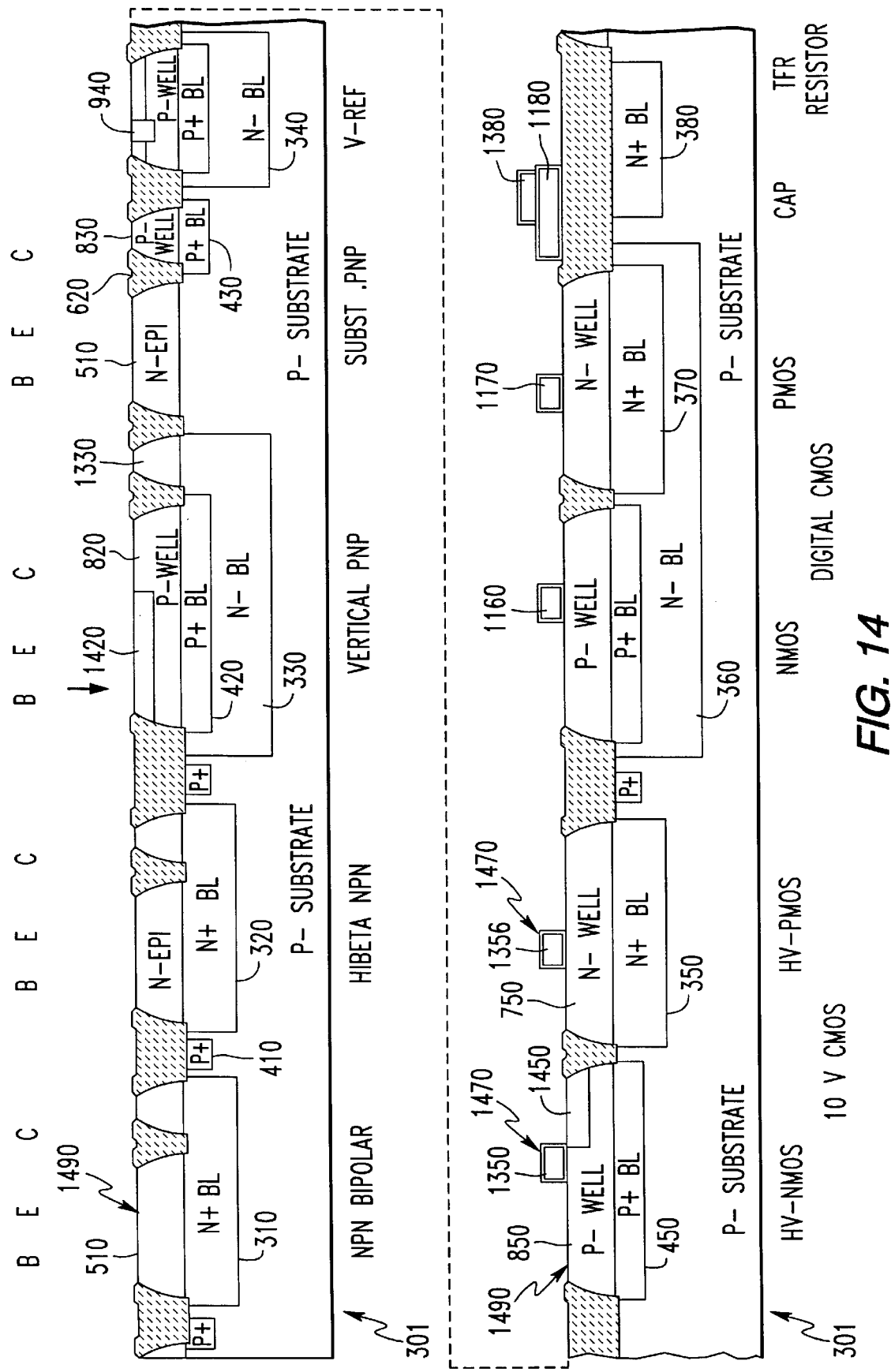

(55) Thermally grow a thin (300 Å) mesa oxide on the exposed surfaces of wafer 301 plus on the exposed surfaces of patterned second polysilicon; this oxide passivates the sidewalls of gates 1350 and 1356. The oxide growth also enhances the thickness of the other oxides. FIG. 14 shows mesa oxide 1490 and sidewall oxide 1470 plus the converted portion 1420 of P well 820 and the drain extension 1450 in P well 850.

(56) Spin a 1.5 μm thick layer of photoresist onto coated wafer 301, and expose and develop a pattern in the photoresist defining the N+ source/drains needed for the digital NMOS devices, the sources needed for analog NMOS devices, and the N well contacts in both analog and digital PMOS devices.

(57) Implant phosphorus ions at 100 KeV and a dose of $1.0 \times 10^{14}$ ions/cm² using the patterned photoresist from step (56) as the implant mask. This phosphorus dose will form a deeper and less heavily doped peripheral portion of the source/drains and provide some doping gradient to lessen the maximum electric fields. Note that the projected range for 100 KeV phosphorus ions is about 1200 Å in silicon and easily penetrates mesa oxide 1490.

(58) Implant arsenic ions at 100 KeV and a dose of $5.0 \times 10^{15}$ ions/cm² using the same patterned photoresist as the phosphorus implant of step (57); this forms the more heavily doped shallower portion of the source/drains. The projected range of 100 KeV arsenic is about 500–600 Å in silicon and oxide. Thus the arsenic implant lies near the surface, and the net donor concentration near the surface will be about $1.5 \times 10^{20}$ atoms/cm$^3$ and at a depth of about 1000 Å the net donor concentration will be about $1.3 \times 10^{20}$ atoms/cm$^3$ at the end of the processing.

Figure 15:
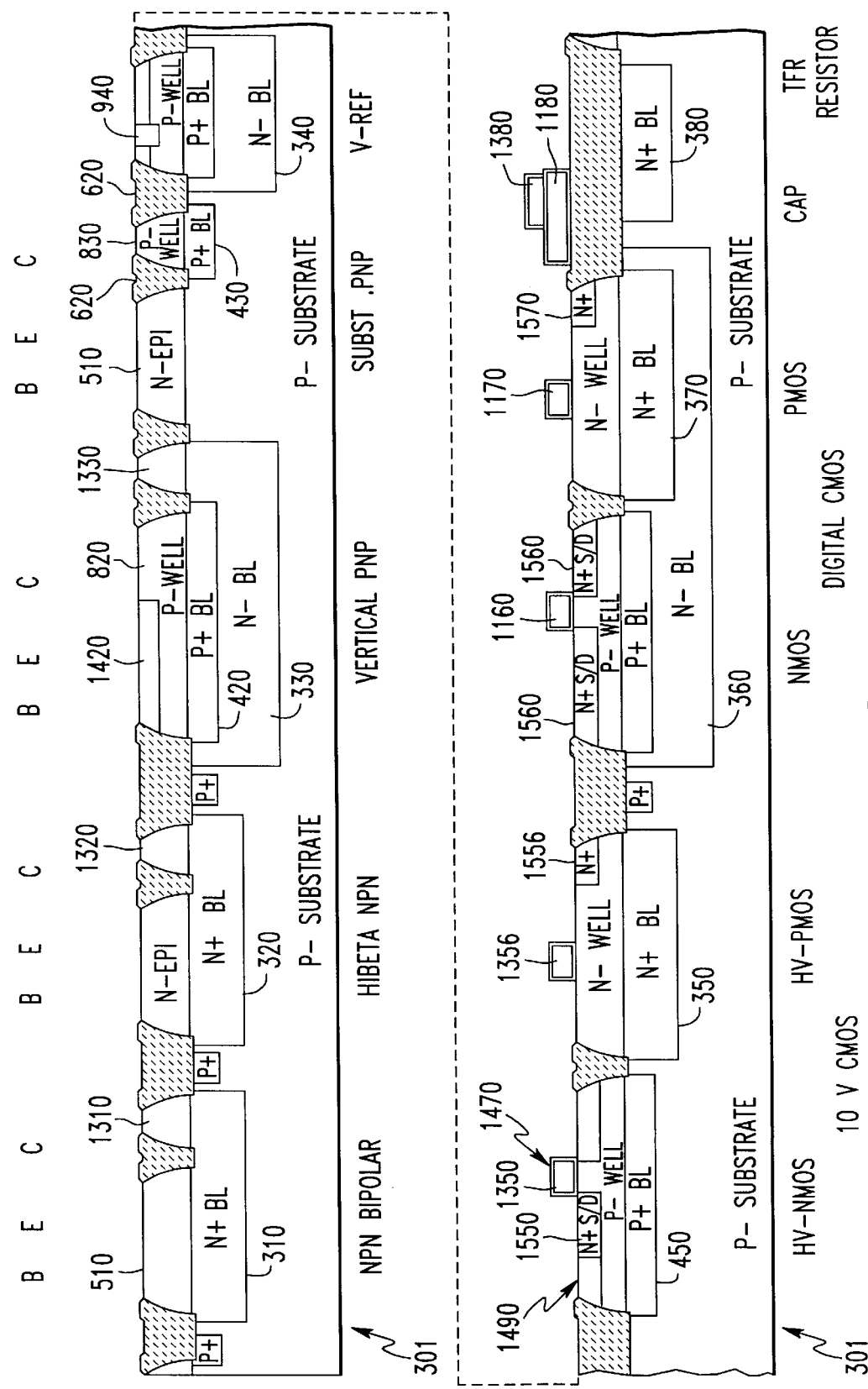

(59) Strip the patterned photoresist by ashing (oxygen burnoff) and piranha. FIG. 15 shows the resulting structure with N+ sources 1550 for analog NMOS devices, N+ well contacts 1556 and 1570 for analog and digital PMOS devices, and N+ source/drains 1560 for digital NMOS devices.

(60) Spin a 1.5 μm thick layer of photoresist onto coated wafer 301, and expose and develop a pattern in the photoresist defining the bases for the high beta NPN devices.

(61) Implant boron ions at 125 KeV and a dose of $6.0 \times 10^{12}$ ions/cm$^2$ using the patterned photoresist from step (60) as the implant mask. This boron dose will form a deeper portion of the bases. Note that the projected range for 125 KeV boron ions is about 4000 Å in silicon and easily penetrates mesa oxide 1490 but does not extend to the bottom of N layer 510 which will form the active collector of the high beta NPN.

(62) Implant boron ions at 30 KeV and a dose of $2.0 \times 10^{12}$ ions/cm$^2$ using the same patterned photoresist as the boron implant of step (61); this forms the shallower portion of the base. The projected range of 30 KeV boron is about 1000 Å in silicon and oxide; the resulting doping level in the active base region averages about $1.5 \times 10^{17}$ atoms/cm$^3$ at a depth of about 0.4 μm. Thus the base will have a fairly small dose very deep, much deeper than the emitter to be formed, so the active electrical charge of the base will be formed predominantly with the implant dose control of the implanter and avoid heavy compensation by the emitter as with diffused base devices. This increases the uniformity and decreases the variability of the high beta NPNs from lot to lot and even within a die; indeed, matches within 1–2% are obtained. The shallow boron implant precludes inversion around the emitter but is totally compensated within the emitter and does not contribute a base electrical charge. This also permits independent tailoring of the radiation hardness of the devices. FIG. 2b shows the doping profile.

(63) Strip the patterned photoresist with piranha.

Figure 16:
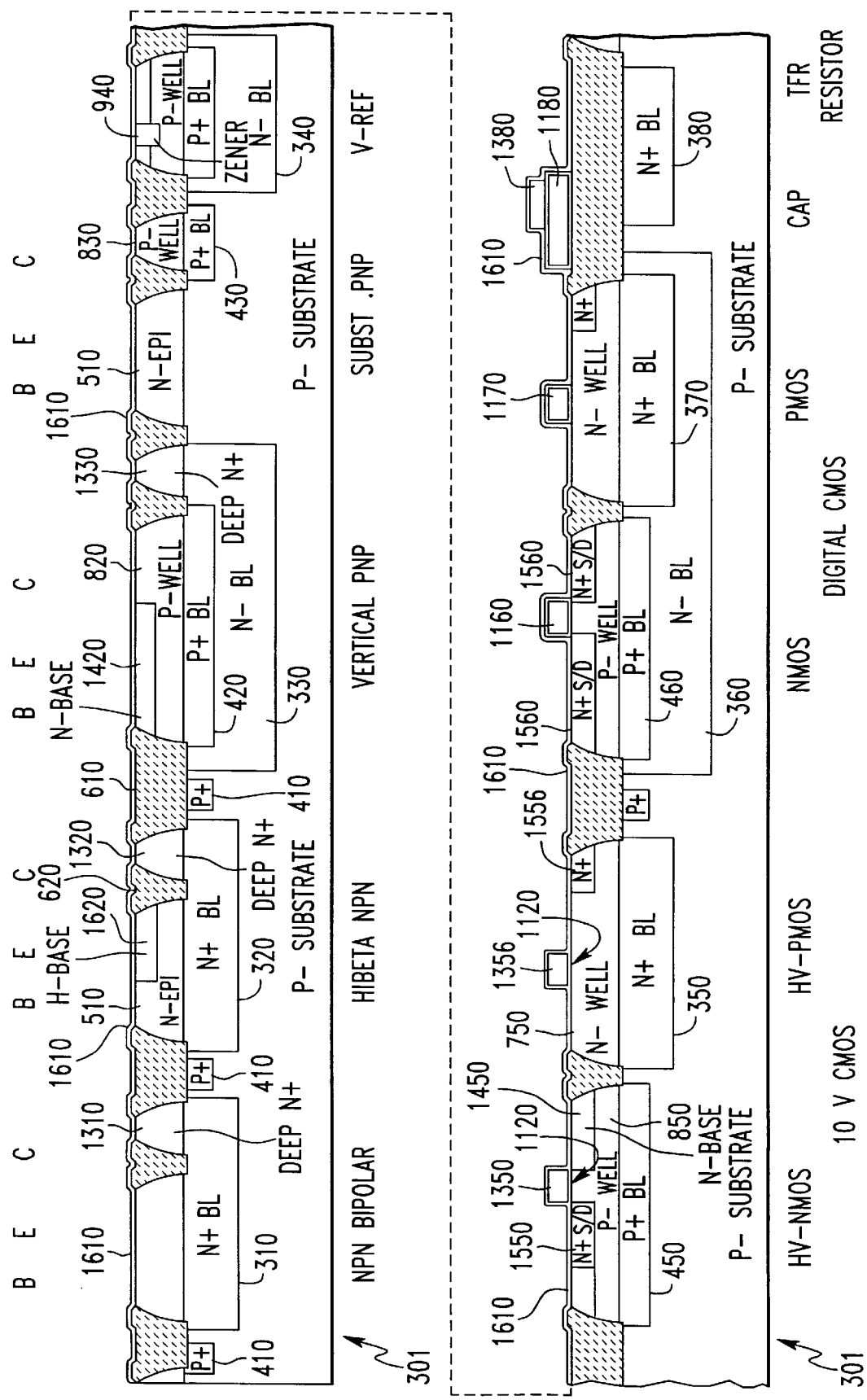

(64) Deposit 2200 Å thick borosilicate glass ("BSG") with CVD by reaction of silane, nitrous oxide, nitrogen, and diborane to yield a glass with boron in the range of 0.5% to 1.5% by weight. Alternately, undoped CVD oxide could be used. The BSG deposits upon the preexisting oxides and brings the total oxide (silicon dioxide plus BSG) thickness on the mesas to about 2500 Å. FIG. 16 shows the resulting H base (P type base for high beta NPN) 1620 in N layer 510 and deposited BSG layer 1610; note that oxide 1490 does not appear separate from BSG 1610. The oxide thickness must be uniform because the active base for the standard NPN devices is implanted through the oxide in step (66) and thus base implant depth and device characteristics uniformity depend upon oxide thickness. The deposition of BSG along with the underlying thermal oxide has a uniformity of about 0.3% of sigma.

(65) Spin a 1.5 μm thick layer of photoresist onto wafer 301, and expose and develop a pattern in the photoresist defining the bases for the standard NPN devices and also the lightly doped drain extensions of the analog NMOS devices.

Figure 17:
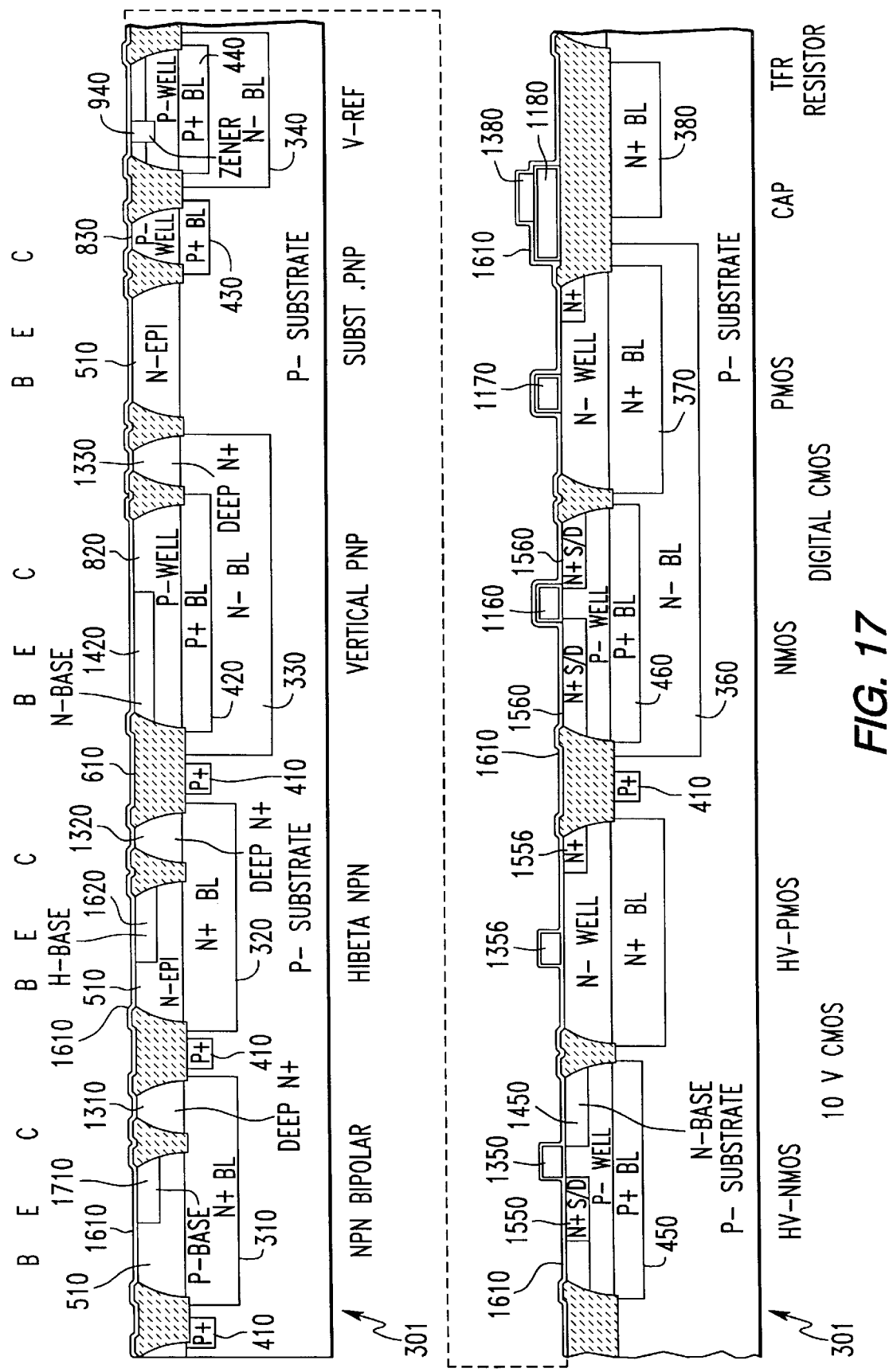
Figure 25A:
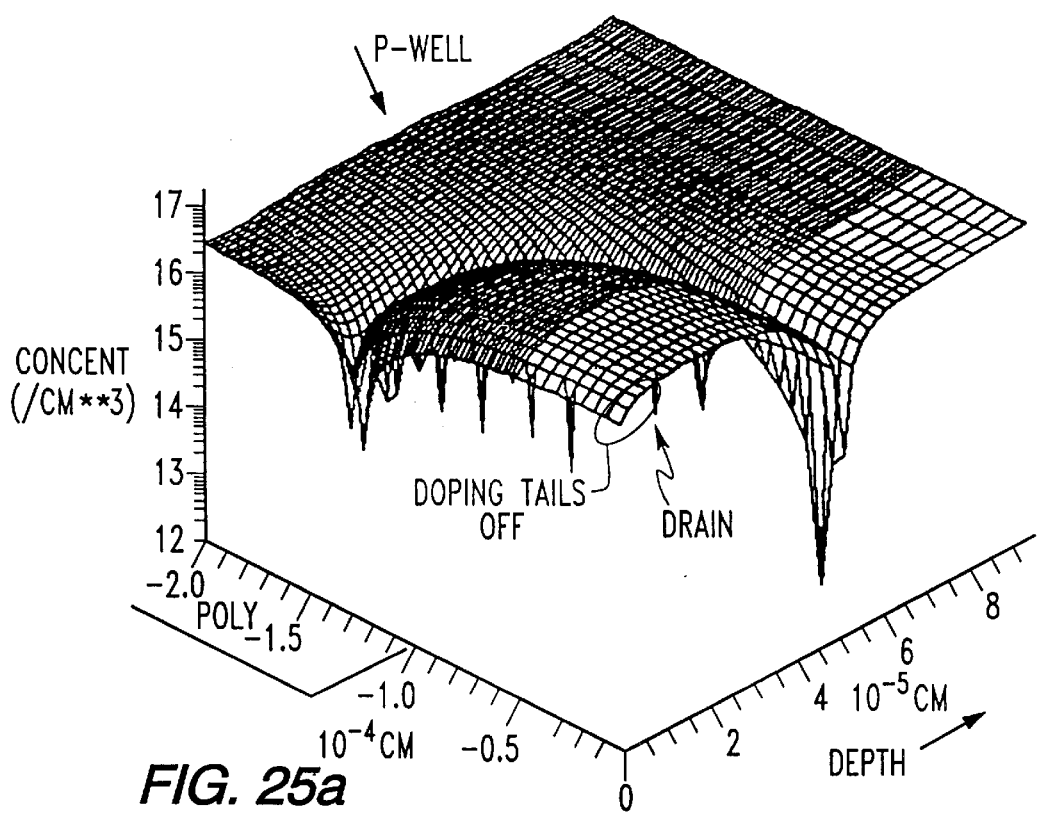
FIGS. 25a–d are comparative cross sectional and three dimensional simulations.

(66) Implant boron ions at 130 KeV and a dose of $4.7 \times 10^{13}$ ions/cm$^2$ using the patterned photoresist from step (65) as the implant mask. Note that the projected range for 130 KeV boron ions is about 4000 Å in silicon and oxide, so after penetrating the 2500 Å thick oxide 1610 the boron travels about 1500 Å into the silicon. Note that the dose exceeds the dose of the high beta NPN, so the standard NPN has a shallower and more conductive base than the high beta NPN. Also, implanting through oxide 1610 insures that crystal damage due to the implant extends to the silicon surface and thus later annealing and crystal regrowth proceeds from the bulk rather than from a surface layer. Also, in the lightly doped drain extensions 1450, the boron compensates much of the phosphorus implanted in step (53) to lower the net N type carrier concentration. FIG. 25a shows the net carrier concentration about the gate edge in cross-sectional elevation view for the analog NMOS devices. FIG. 17 illustrates base 1710 and the now-compensated lightly doped drain 1450.

(67) Strip the patterned photoresist with piranha.

(68) Anneal wafer 301 to activate the implants and regrow damaged crystal at 950° C. in a nitrogen atmosphere for 60 minutes.

(69) Spin a 1.5 μm thick layer of photoresist onto wafer 301, and expose and develop a pattern in the photoresist defining the locations of P+ source/drains of both the analog and the digital PMOS devices, P well contacts for both the analog and digital NMOS devices, base contacts for both standard and high beta NPN devices, collector contacts and emitters for both isolated and substrate PNP devices, and anode contact for Zener diodes.

(70) Implant boron ions at 100 KeV and a dose of $1.2 \times 10^{15}$ ions/cm$^2$ using the patterned photoresist from step (69) as the implant mask. Note that the projected range for 100 KeV boron ions is about 3000 Å in silicon and oxide with a projected straggle of about 600 Å. Thus the peak of the implant lies near the surface of the silicon under the 2500 Å thick oxide 1610, and high concentrations of boron extend a few hundred Å into the silicon. This implant also could be used to form substrate resistors with resistivities of about 100 ohms/square. Note that the implant of step (66) which forms the bases for the NPN devices also could be used to form substrate resistors with resistivities of about 1000 ohms/square and the implant of steps (60–62) for bases of high beta NPN devices leads to substrate resistors of about 3000 ohms/square. In contrast, the NiCr resistors made in steps (87–89) and which are laser trimmable form resistors of about 200 ohms/square, and resistors made from the doped polysilicon layers have resistivities of about 12 ohms/square. This indicates that the first preferred embodiment method has a variety of resistivities for resistor fabrication.

Figure 18:
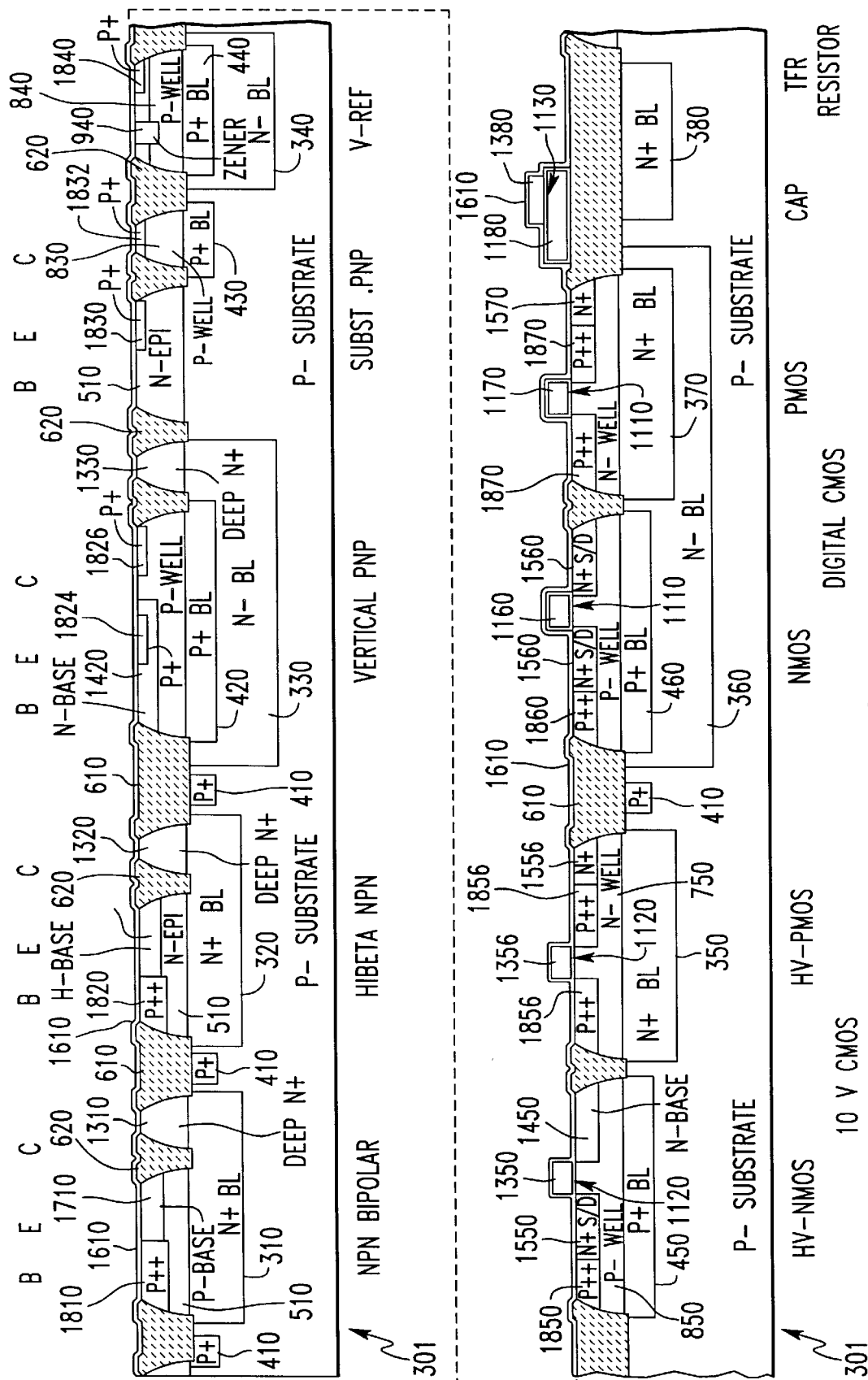

(71) Strip the patterned photoresist with piranha. FIG. 18 shows NPN base contact 1810, high beta NPN base contact 1820, isolated PNP emitter 1824 and collector contact 1826, substrate PNP emitter 1830 and collector contact 1832, Zener diode anode contact 1840, analog NMOS well contact 1850, analog PMOS source/drains 1856, digital NMOS well contact 1860, and digital PMOS source/drains 1870.

(72) Deposit 7800 Å thick borophosphosilicate glass ("BPSG") by CVD using silane, nitrous oxide, nitrogen, phosphine, and diborane to yield 2–3% boron and 3.5–4.5% phosphorus by weight. The BPSG deposits upon the preexisting oxides and brings the total oxide (silicon dioxide plus BSG plus BPSG) thickness on the mesas to about 1 μm, and this oxide is called the Field Oxide. The BPSG over planar areas has a thickness variation of only about 0.3%, so the total oxide also has high thickness uniformity.

(73) Densify the BPSG of step (72) in steam at 800° C. for 20 minutes to stabilize the boron and phosphorus dopants. Theoretically, this densification uses the catalytic effect of hydrogen and rapid diffusion of steam to drive the boron and phosphorus dopants to bind to oxygen in the silicon dioxide and thus lessens the outdiffusion of dopants during later processing. That is, the boron and phosphorus in the as-deposited BPSG are primarily elemental, and the steam densification oxidizes the boron and phosphorus. Indeed, the diffusion of elemental dopants from BPSG into the NiCr or other thin-film resistors to be formed later disrupts the resistor stability and degrades the capability of targeting the final value of resistivity. Experimentally, steam densified BPSG released less than about $2 \times 10^{19}$/cm$^3$ boron into a NiCr thin film, whereas dry densified BPSG released at least about $1 \times 10^{20}$/cm$^3$ boron into a NiCr thin film. The bonding of the boron and phosphorus to oxygen can be detected, at least in the upper portions of the BPSG layer, by XPS (Xray photospectrometry), FIIR (Fourier transform infrared), or SIMS (secondary ion mass spectroscopy). The densification should convert most of the boron and phosphorus to oxygen-bonded form.

Figure 24:
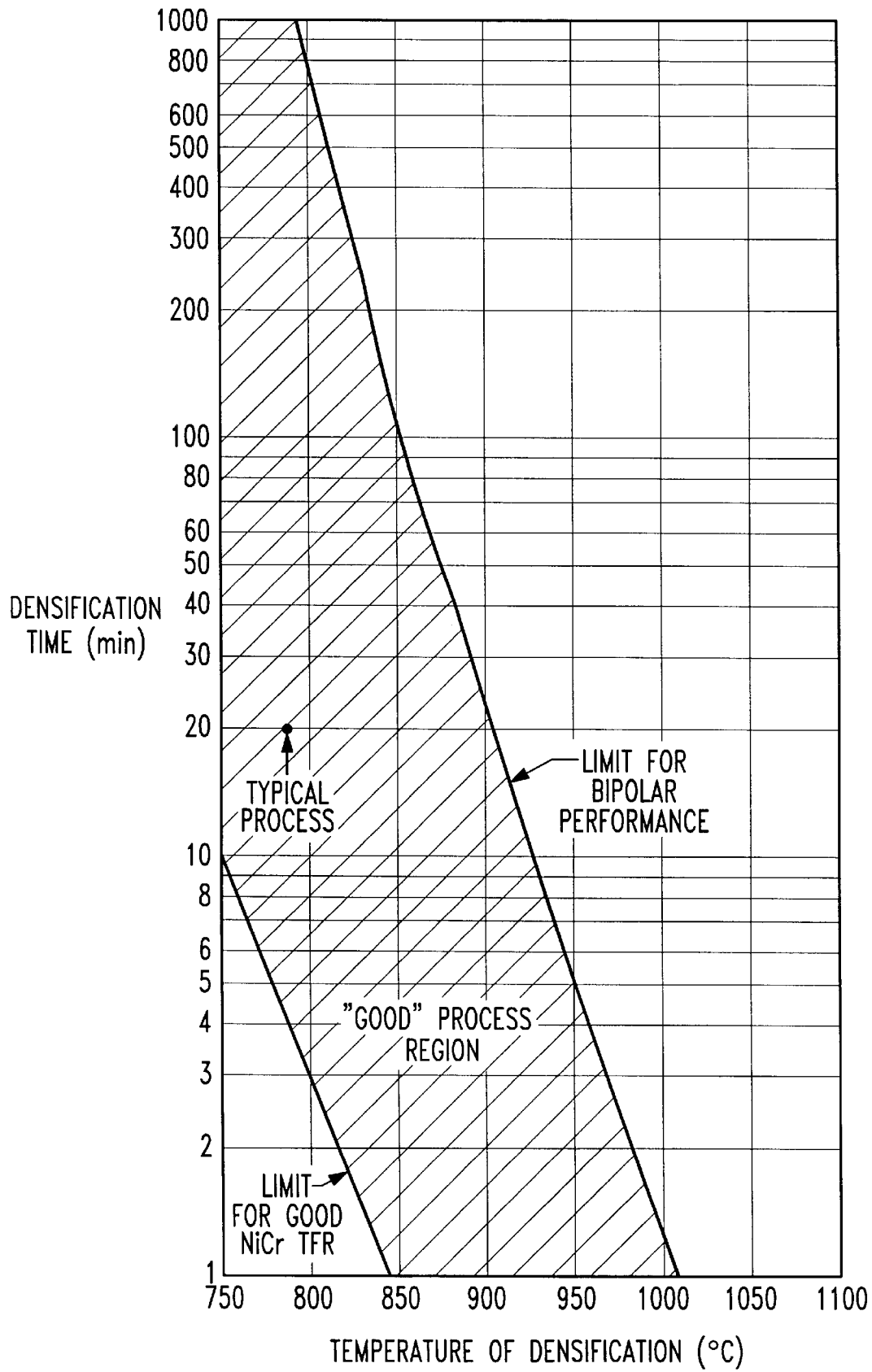
FIG. 24 illustrates a time-temperature trade-off.

However, steam densification degrades NPN performance, possibly by base grading out to decrease the Early voltage or by dopant segregation at the emitter periphery. Thus densification should be as short as possible and at as low a temperature as possible and still stabilize the dopants. FIG. 24 shows a time-temperature trade-off for the steam densification. Of course, the limits could be shifted depending upon the BPSG composition and the resistor and NPN tolerances. Furthermore, steam densification appears to degrade NMOS hot electron performance if the boron percentage in the BPSG is high and the phosphorus percentage low; whereas if the phosphorus percentage is high and the boron percentage is low, then little degradation occurs. Thus confine the boron to the range of 1% to 3% and have the phosphorus percentage at least 1 higher than the boron percentage. For example, 2.25% boron and 4.5% phosphorus yields good overall results. This steam densification also increases the adherence of the TiW metal deposited in step (91) to the BPSG. Adherence problems for dry densified BPSG may also arise from the out diffusion of dopants.

(74) Spin a 1.5 $\mu$m thick layer of photoresist onto coated wafer 301, and expose and develop a pattern in the photoresist defining the contacts to active regions of all devices and also to any substrate resistors.

(75) Plasma etch the oxide with CHF$_3$ and O$_2$ using the patterned photoresist as an etch mask and with endpoint detection. Note that the oxide has various thicknesses, although each of the thicknesses is quite uniform: the deposited oxide is 2150 Å thick, and the BPSG is 7800 Å thick. If the thermal oxide is 350 Å thick in the emitter area, then the thermal oxide would be 2000 Å thick over the collector (an additional 1650 Å), and the thermal oxide would be 1200 Å thick over the first polysilicon gates (an additional 850 Å). This etch selective etches oxide at a rate more than nine times that of silicon, but to clear the oxide over the collector, with endpoint detection etch stop, leads to the removal of 200–300 Å of silicon in the emitter area. This removal is tolerably small because the oxides are uniform and thus require only a minimal overetch. Note that a buffered HF etch generally has better selectivity than plasma etches and does not create the crystal damage due to high energy ion impacts of a plasma, but wet etches generally cannot achieve the small geometries for high digital device packing, especially through thick (1 $\mu$m) oxides.

Figure 19:
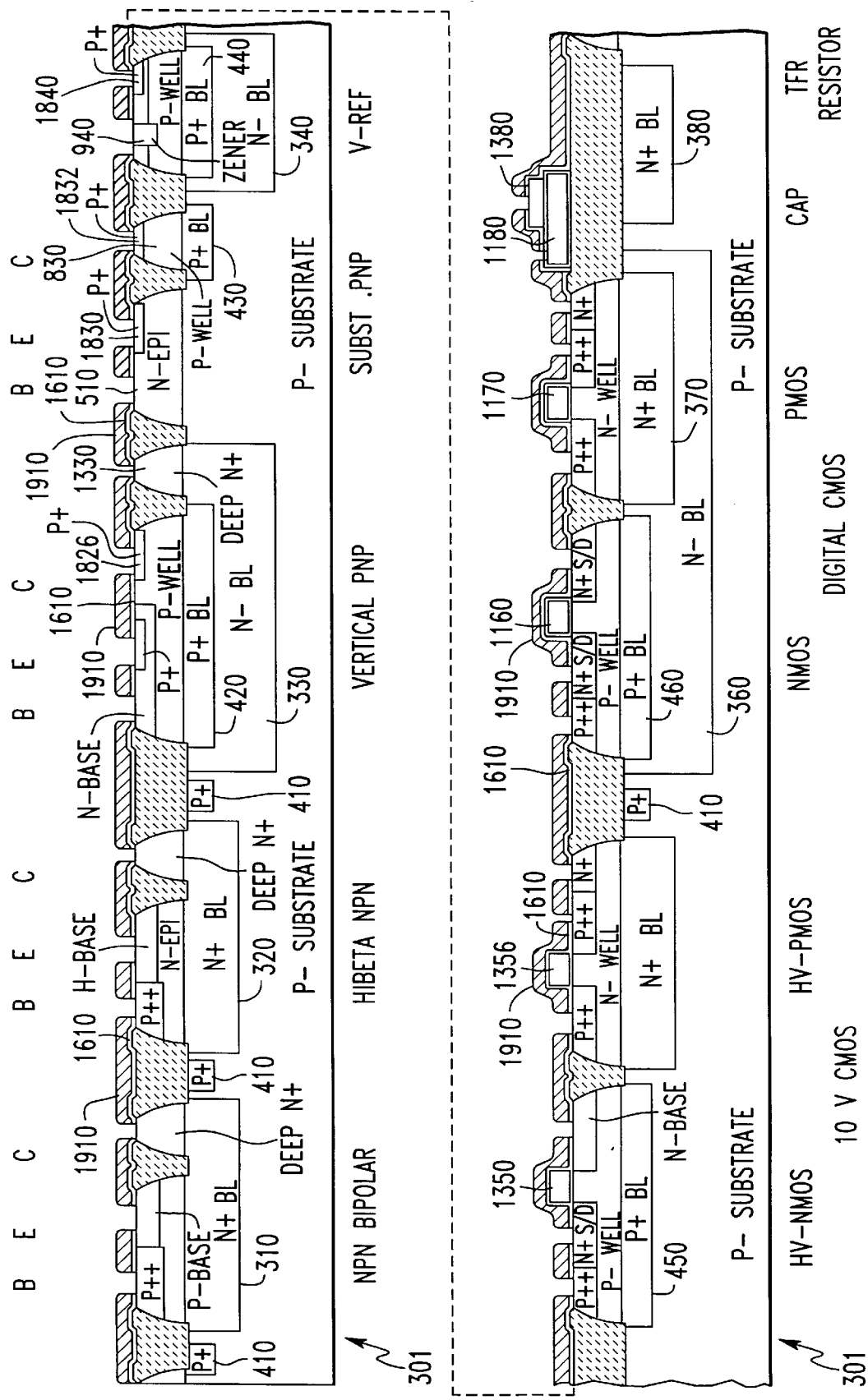

(76) Strip the patterned photoresist with piranha; FIG. 19 shows the resulting BPSG 1910 plus BSG plus thermal oxide with smooth topography plus apertures for contacts.

(77) Spin a 1.5 $\mu$m thick layer of photoresist onto coated wafer 301, and expose and develop a pattern in the photoresist defining the locations of N+ + which includes the NPN (both standard and high beta) emitters, the tops of deep N+ contacts 1310, 1320, and 1330, the base contact PNPs (both isolated and substrate), the Zener diode cathode, and the contact to the drain of the analog NMOS devices.

Figure 20:
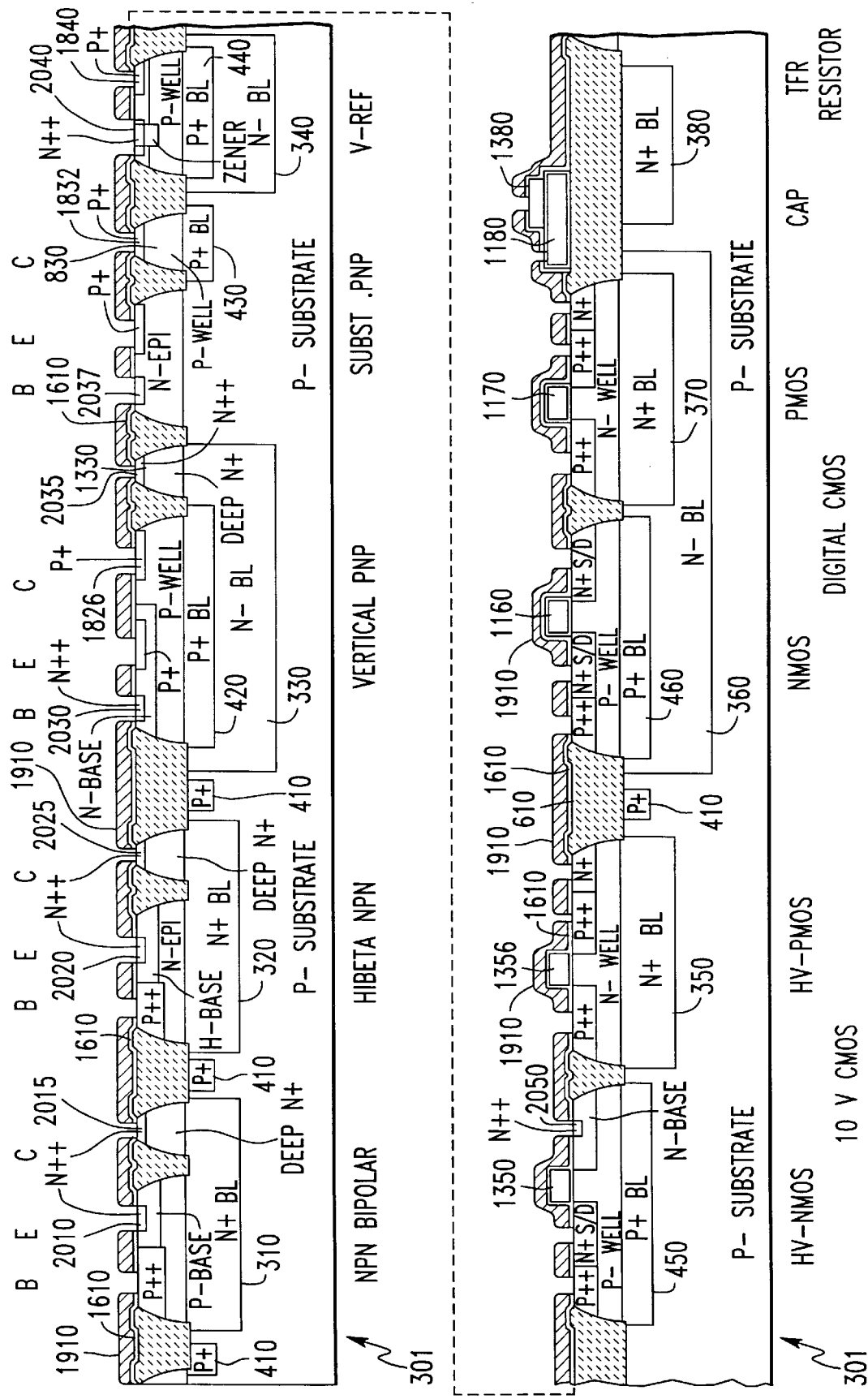

(78) Implant arsenic ions at 80 KeV and a dose of $1.0 \times 10^{16}$ ions/cm$^2$ using the patterned photoresist from step (77) plus the exposed apertured BPSG as the implant mask. Note that the projected range for 80 KeV arsenic ions is about 500 Å in silicon. The N+ + emitters formed are called "washed emitters" and are the same size as and self-aligned to the contact apertures in BPSG 1910 created in step (75). N+ + also forms enhanced contact regions to other N-type regions like the N base of the PNP transistors. The deep N+ contacts, which cost no diffusion or deposition step, came efficiently at the polysilicon doping step. This N+ + arsenic implant damages the surface of wafer 301 and the resultant defects enhance the diffusivity of the phosphorus previously deposited during the polysilicon doping step. Thus shorter and lower temperature anneals of the base and emitter implants may be used and still diffuse the phosphorus down to the N+ buried layers 310 and 320 plus N buried layer 330. The implanted emitter self-aligns to the contacts apertures from step (75) rather than being nested in conventional analog fabrication. Thus the washed emitter can be the same size as the minimum contact aperture provided by the lithography used and is much smaller than a nested emitter. FIG. 20 shows the N+ + implanted regions 2010 (NPN emitter), 2015 (NPN collector contact), 2020 (high beta NPN emitter), 2025 (high beta NPN collector contact), 2030 (isolated PNP base contact), 2035 (contact to buried layer 330), 2037 (base contact for substrate PNP), 2040 (Zener cathode), and 2050 (contact to drain of high voltage NMOS). The hot electron immunity, reduction in ionization current and the snapback holding voltage of the high voltage NMOS can be enhanced by varying the spacing between ohmic contact 2050 and gate 1350.

(79) Strip the patterned photoresist by ashing plus piranha.

(80) Deposit 200 Å thick cap oxide with CVD by reaction of silane, nitrous oxide, and nitrogen at 400° C. The oxide deposits upon both the exposed silicon in the apertures formed during step (75) and the preexisting oxides (BPSG 1910 on mesa oxide 1610). The cap oxide provides a barrier against autodoping during the arsenic implant activation anneal to follow in step (81). Without cap oxide, dopants would diffuse out of the BPSG (which is about 2.25% boron oxide and 4.5% phosphorus oxide) and into the exposed silicon.

(81) Anneal coated wafer 301 at 1,000° C. in a nitrogen atmosphere for 8 minutes (general 950°–1050° C. for 5–30 min). This anneal activates and diffuses the arsenic implants of step (78) to a depth of 0.3 $\mu$m plus flows the BPSG 1910 to smooth out the corners of the apertures etched in step (75) and over poly lines.

(82) Etch the cap oxide with buffered HF; this opens the bottoms of the apertures in BPSG 1910 and mesa oxide 1610. Note that the cap oxide (deposition in step (80) and removal in this step) could be omitted if autodoping during the anneal to activate the emitter implants does not push device characteristics out of an acceptable range.

(83) Sputter deposit a 220 Å thick layer of platinum onto coated wafer 301.

(84) Sinter platinum-covered coated wafer 301 in a nitrogen atmosphere at 450° C. for 50 minutes. The platinum which deposited upon the silicon exposed by the apertures of step (75) reacts with the silicon to form platinum silicide (PtSi), whereas the platinum which deposited upon the BPSG does not react because silicon, phosphorus, and boron are all more electropositive than platinum and will not be reduced by the platinum. Note that PtSi forms on both P type and N type silicon and broth single crystal silicon and polysilicon, so all contacts to silicon will have a PtSi interface. PtSi has a high conductivity of 6–8 ohms/square for a thin (<500 Å) layer, and a low barrier to P-type silicon.

(85) Strip the unreacted platinum while leaving the PtSi with a wet etch using aqua regia (HCl plus $HNO_3$) which dissolves platinum by forming soluble platinum chlorides.

(86) Spin a 1.5 μm thick layer of photoresist onto coated wafer 301, and expose and develop a pattern in the photoresist defining the locations for nickel chromium (NiCr) thin film resistors on top of BPSG 1910.

(87) Wet etch, with buffered HF, the surface of the oxide (BPSG 1910) exposed through the openings in the patterned photoresist to slightly undercut the photoresist. The undercut insures that the subsequent deposited NiCr does not build up at the vertical photoresist edges of the exposed oxide and prevent a clean lift-off.

(88) Sputter deposit a 100 Å thick layer of NiCr (60% Ni and 40% Cr) onto photoresist covered coated wafer 301. This NiCr film is so thin that it does not cover the sidewalls of the openings in the patterned photoresist but rather just covers horizontal surfaces; namely, the exposed BPSG in the photoresist openings and the top surface of the photoresist.

(89) Lift-off the patterned photoresist by dissolving it in a solution of acetone, methanol, and deionized water. This also lifts off the NiCr that deposited upon the top surface of the photoresist but does not affect the NiCr deposited upon BPSG 1910.

Figure 21:
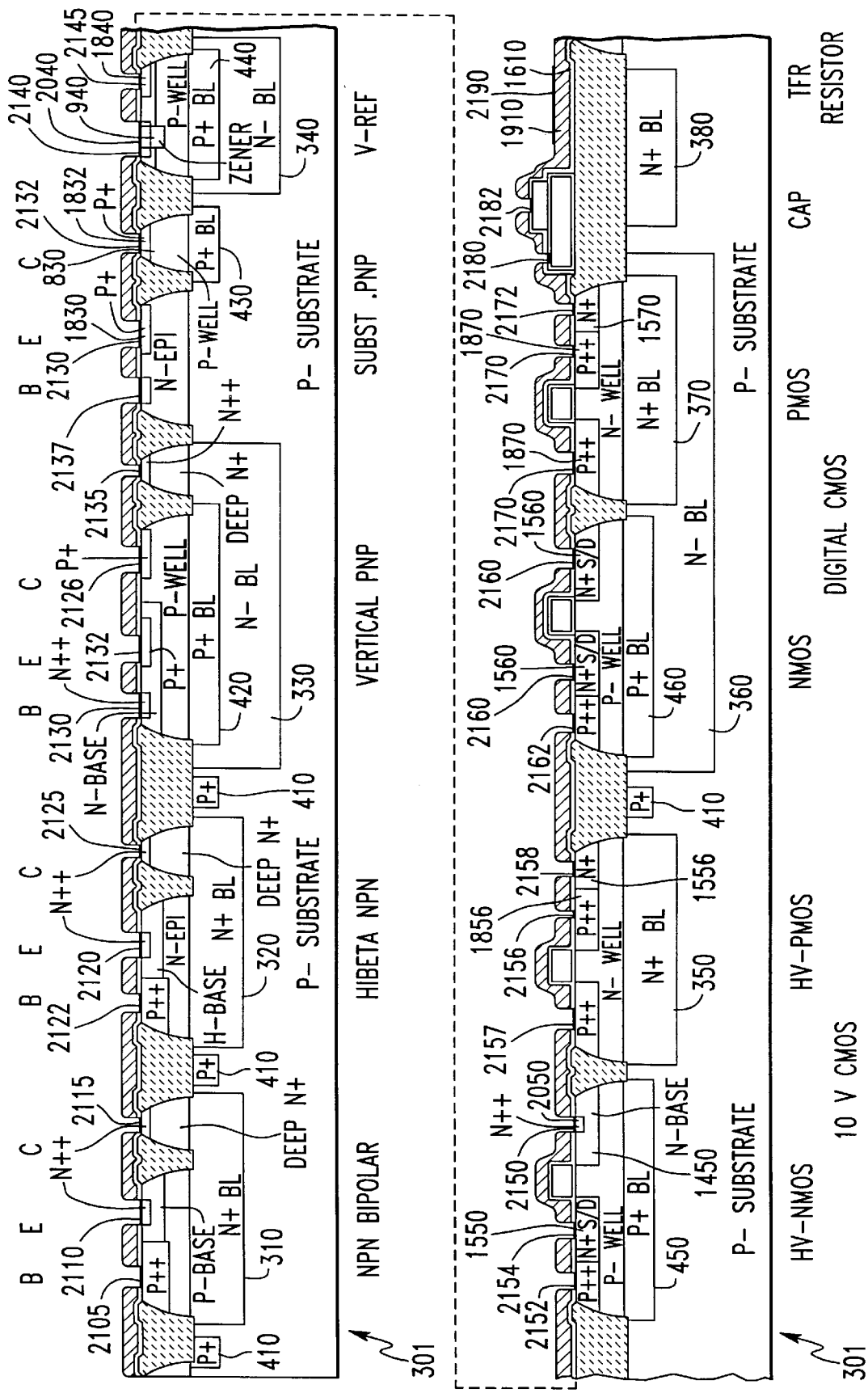

(90) Strip any remaining patterned photoresist with organic solvent such as AZ300T. Note that the entire lift-off process could have been achieved with an organic solvent such as AZ300T alone, eliminating step (89). FIG. 21 shows PtSi interfaces 2105–2182 and NiCr resistors 2190.

(91) Sputter deposit a 1700 Å thick layer of titanium tungsten (TiW which is basically tungsten with about 10% titanium added for adhesion) and then sputter deposit a 6,000 Å thick layer of copper silicon aluminum (about 1% copper and ½% silicon with the copper added to suppress hillocking and the silicon about the saturation limit). These two layers form the first metal level and may include local interconnections. Adhesion is also promoted by the previous steam densification of BPSG 1910.

(92) Spin on photoresist and expose and develop it to define locations over the PtSi interfaces and contacts to the NiCr resistors.

(93) Plasma etch the copper silicon aluminum with $Cl_2$ plus $BCl_3$ using the patterned photoresist as the etch mask. This plasma etch permits high packing density because it avoids the undercut and line width decrease of wet etches. The plasma etch proceeds very slowly in TiW and the etch is terminated before penetration of the TiW. Thus the TiW effectively protects the underlying thin NiCr from plasma etch damage and subsequent change of resistivity.

(94) Strip the patterned photoresist with organic solvent such as AZ300T.

Figure 22:
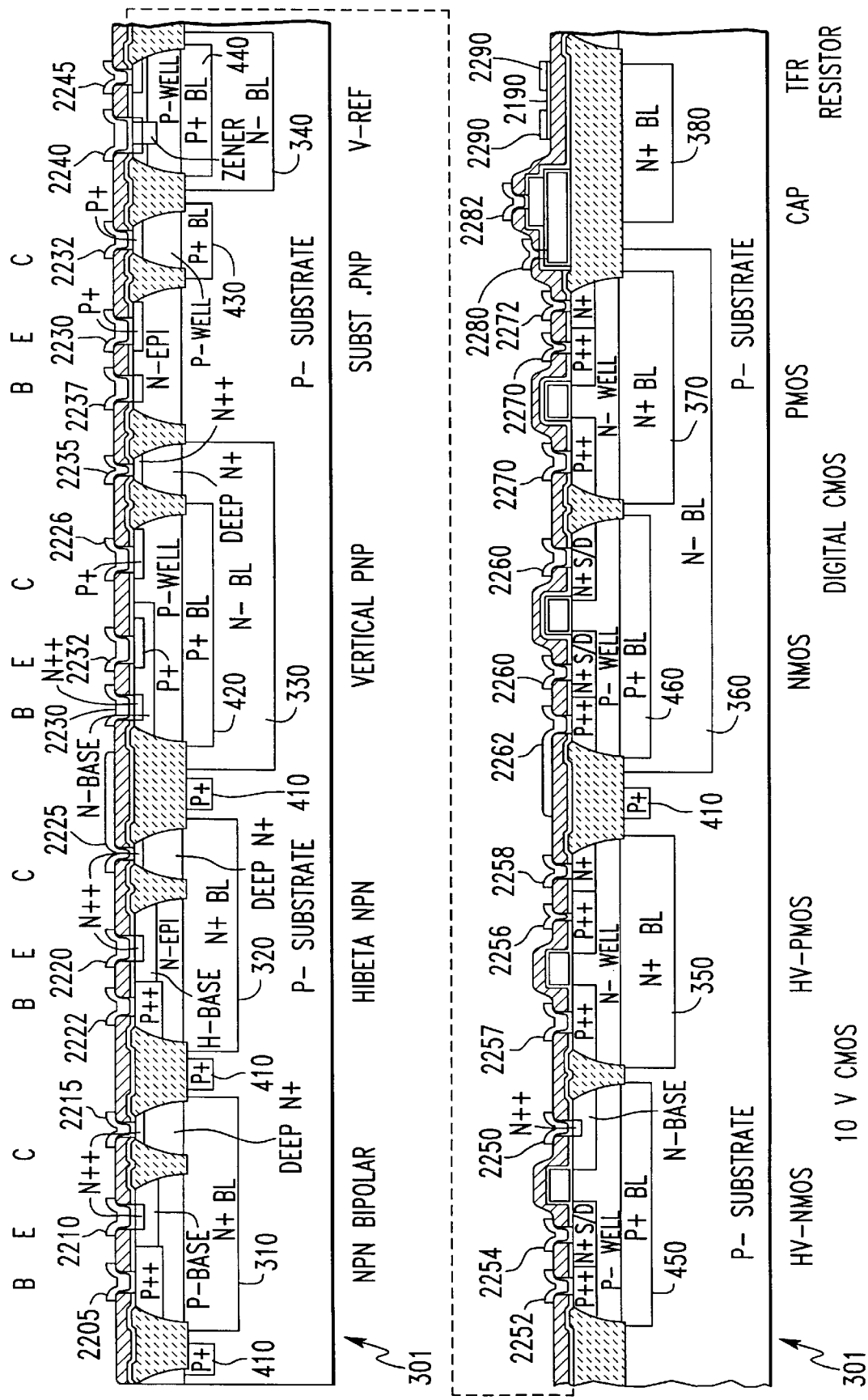

(95) Wet etch the exposed TiW with $H_2O_2$ which selectively stops etching at NiCr, BPSG, and aluminum. Indeed, the copper silicon aluminum remaining from the plasma etch of step (93) protects the underlying TiW except at the film edges where some undercutting occurs. Because the TiW is only 1700 Å thick, the undercut can be held to 2550 Å even with a 50% overetch. FIG. 22 illustrates the patterned first level metal contacts 2205–2290.

(96) Deposit 2.3 μm thick interlevel oxide 2310 by CVD from reaction of TEOS and oxygen at 390° C. to cover the first level metal, NiCr resistors 2190 and BPSG 1910. The interlevel oxide will provide the interlevel dielectric between the first and second metal levels, but the upper surface of the oxide has topography roughly reflecting the bumpiness of the underlying first level metal which has 8000 Å high dropoffs.

(97) Sinter at 475° C. in forming gas (75% $N_2$ plus 25% $H_2$); this reduces contact resistance of the first level metal to PtSi to silicon.

(98) Spin on 1.5 μm thick photoresist and expose and develop it to define locations over the first level metal for vias to second level metal. Note that the photoresist has covers the bumpiness of the interlevel dielectric but has an essentially flat top surface except for the patterned vias.

(99) Plasma etch the interlevel dielectric 2310 with the via patterned photoresist as the etch mask using $CHF_3$ plus $O_2$ which etches both the interlevel dielectric and the photoresist. Thus the via pattern persists through the interlevel dielectric and the planar surface of the patterned photoresist propagates to planarize the interlevel dielectric surface; however, the isotropic nature of the etch broadens the vias and slopes their sidewalls. The etch stops in the vias when it reaches first level metal except for the lateral etching; thus the depths of the vias can vary to accommodate variation in the thickness of the interlevel dielectric. The etch is timed and stopped to insure a minimum thickness of at least 0.5 μm of interlevel dielectric at its thinnest portion, which occurs over the poly-to-poly capacitors due to the stacked polysilicon layers.

(100) Strip any remaining patterned photoresist with organic solvent.

(101) Sputter deposit a 1.6 μm thick layer 2320 of silicon aluminum (1% silicon) on the planarized interlevel dielectric 2310 for second level metal. The second level metal covers the sloped sidewalls of the vias in the interlevel dielectric to connect to the first level metal exposed at the bottoms of the vias. Bond pads are formed in second level metal.

(102) Spin on photoresist and expose and develop it to define the second level metal interconnections.

(103) Plasma etch the silicon aluminum 2320 with $Cl_2$ plus $BCl_3$ and $CHF_3$ using the patterned photoresist as the etch mask.

(104) Strip the patterned photoresist with a plasma of oxygen plus a follow up wet strip with organic solvent as a clean up.

Figure 23:
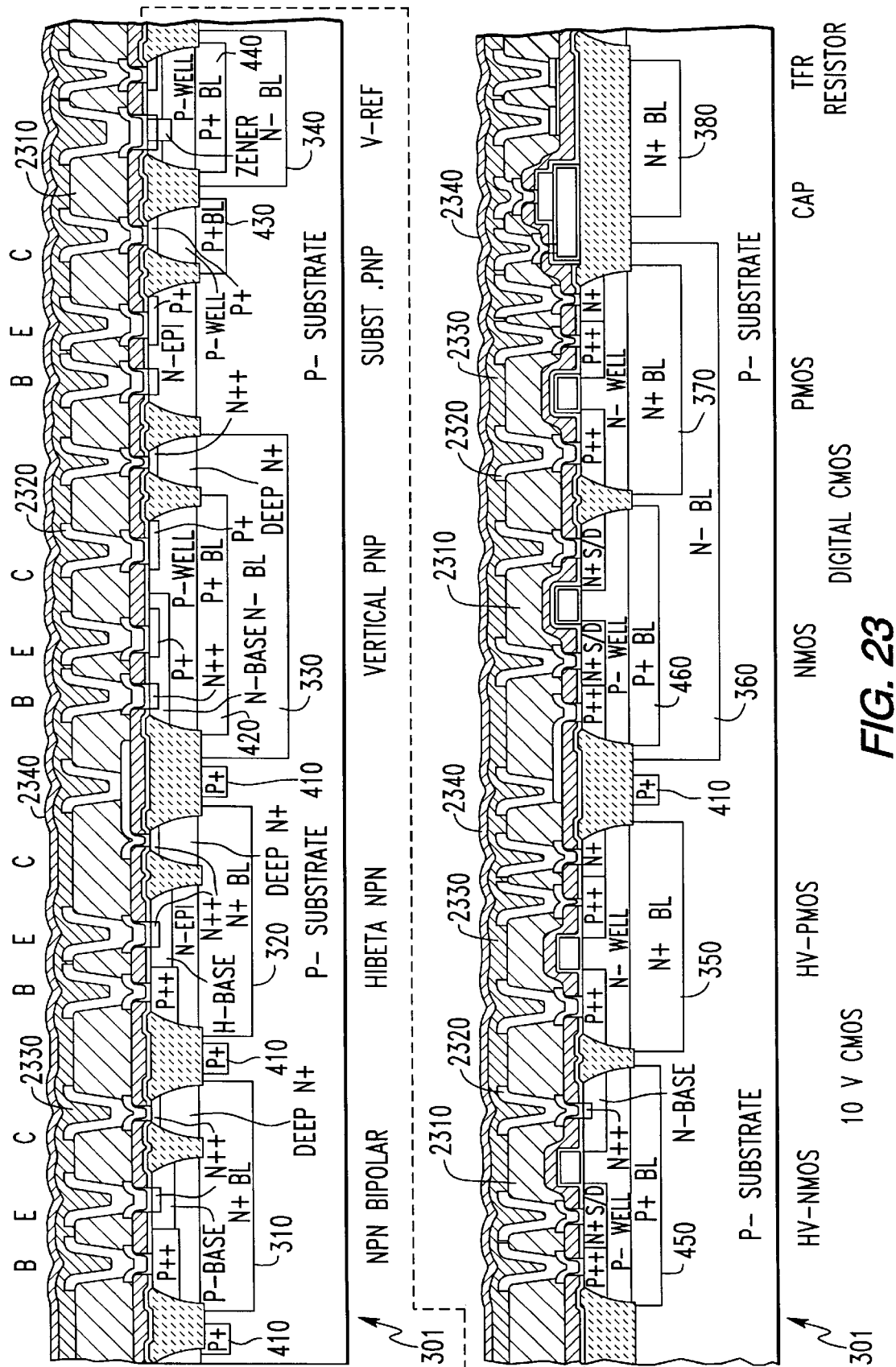

(105) Deposit 0.8 μm thick oxide 2330 by reacting TEOS plus oxygen with the middle 0.6 μm doped with phosphorus. Then deposit 0.4 μm thick silicon nitride 2340. The oxide and nitride will form the passivation layer, which has a total thickness, including the interlevel oxide from step (96), of about 2.2 μm over NiCr resistors 2190. A plasma reaction of silane with ammonia and nitrogen using dual RF (13 MHz and 600 KHz) deposits nitride with a low hydrogen and low Si—H bond content to improve subsequent laser trimming results. Typical nitride films have 30% (atomic percent measured) total hydrogen and 20% Si—H bonded hydrogen, whereas nitride 2340 has only 20% total hydrogen and 12% Si—H bonded hydrogen. Hydrogen not Si—H bonded is usually N—H bonded and stable, so the reduction of Si—H bonded hydrogen by about a factor of two provides laser trimming benefits noted in the following. See FIG. 23 showing interlevel oxide 2310, second level metal 2320, passivation oxide 2330, and passivation nitride 2340.

(106) Sinter at 475° C. in a nitrogen atmosphere to reduce the via resistance.

(107) Spin on photoresist and expose and develop it to define openings to the bond pads.

(108) Plasma etch nitride 2340 with $CF_4$ and wet etch oxide 2330 with buffered HF down to the bond pads.

(109) Strip the patterned photoresist with organic solvent. This completes the semiconductor processing of wafer 301.

To finish the fabrication: probe die on the wafer; laser trim precision analog circuits including laser trim the NiCr resistors by focussing a laser beam through interlevel oxide 2310, passivation oxide 2330, and nitride 2340 to vaporize portions of the NiCr film; saw wafer 301 into dice; mount the individual dice on lead frames; connect bond wires to the bond pads; electrically test the mounted and bonded dice; and lastly package the trimmed dice.

The laser trimming of NiCr thin film resistors typically has a pulsed laser spot scan the thin film and melt/disperse away portions of it into the oxide. This increases the resistance by removing metal. However, the kerf area at the edges of the cut portions is a complex scalloped structure of partially removed metal, and this kerf area can apparently change conductivity over time. Indeed, resistors which have been laser trimmed typically show much greater resistance drift over time than untrimmed resistors. Experimentally, laser trimmed NiCr resistors with oxide plus nitride passivation show very good stability when the nitride has a low Si—H content (12%) and low stress ($2 \times 10^8$ dynes/cm$^2$ compressive) as in step (105) but poor stability when the nitride has the typical high Si—H content (20%) and high stress ($2 \times 10^9$ dynes/cm$^2$). There are three possible explanations for the dependence of resistance drift on the nitride characteristics:

(1) Si—H bonds are weak and nitride with high Si—H content may release free hydrogen. Such free hydrogen may assist the regrowth or annealing of kerf areas over the operating life of the resistor and thereby lower resistance over time. Note that hydrogen has been found responsible for changing the resistance of single crystal and polysilicon diffused resistors, and hydrogen in the form of steam has been shown to be more effective than oxygen treatment in annealing oxides.

(2) The compressive stress of the nitride may mechanically move the NiCr over time and thereby change its resistance. And the movement in the kerf area will dominate the resistance change.

(3) Si—H bonds scatter the laser light and spread out the spot during trimming. This leads to a broader kerf area and consequent greater kerf changes.

Figure 25B:
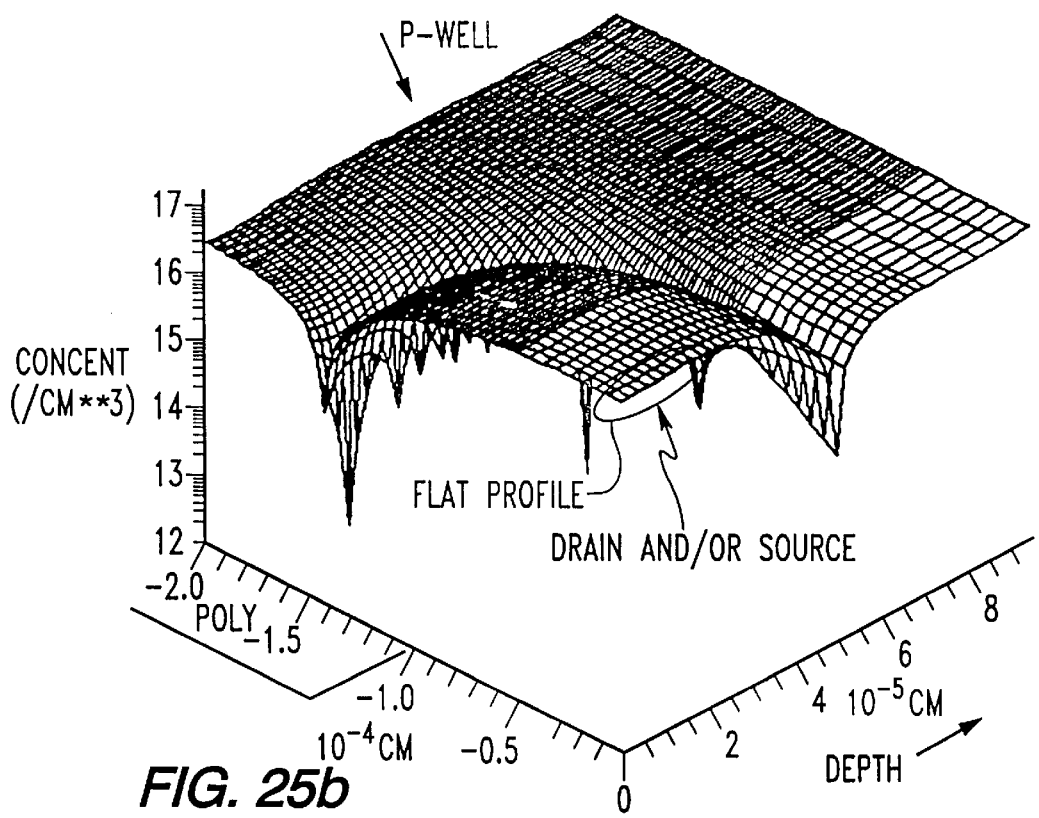

FIG. 25a depicts a three dimensional doping profile for a simulated compensated drain high voltage NMOS transistor with the location of gate 1350 indicated. For comparison, FIG. 25b is the result of the same simulation for a conventional drain NMOS transistor. The implant dose parameters for the transistor in FIG. 25a were N base=$5.0 \times 10^{13}$ phosphorus/cm$^2$ and P base=$4.7 \times 10^{13}$ boron/cm$^2$ which resulted in a compensated drain N-type dose of $8.55 \times 10^{12}$/cm$^2$. Recall that the P base implant is performed through a screening oxide (~ 2500 Å), so some of the P base dose remains in the oxide and is not active. Nearly 100% of the implanted N base dose is active in the silicon. This is the reason why the actual compensated dose is larger than the mathematical difference in the two base implant does ($8.55 \times 10^{12} > 3.0 \times 10^{12}$). The phosphorus implant dose for the transistor in FIG. 25b is $8.55 \times 10^{12}$/cm$^2$ so that it matches the transistor in FIG. 25a.

Figure 25C:
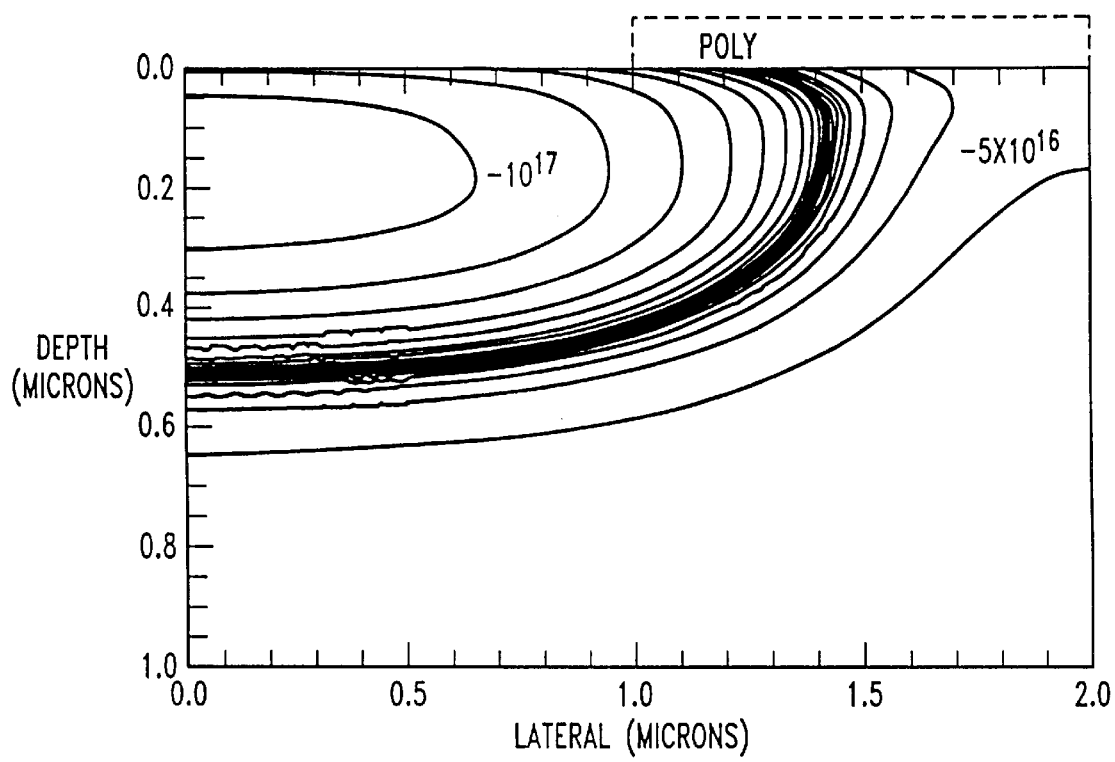
Figure 25D:
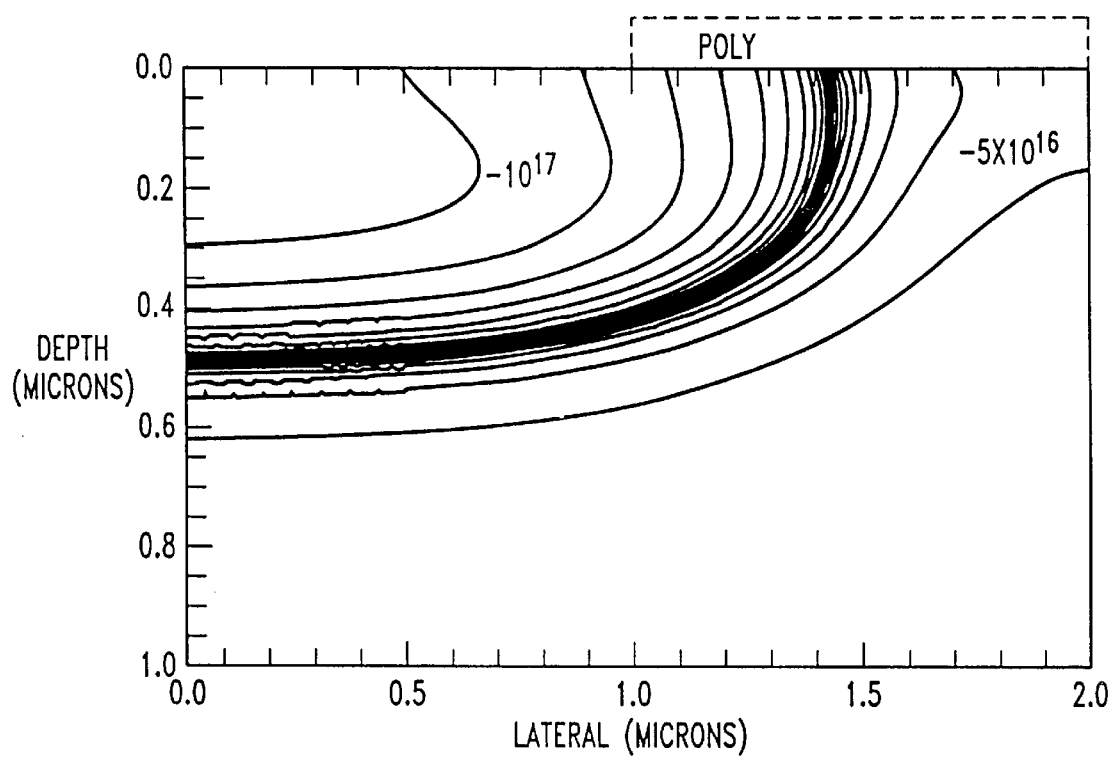

The PNP base implant energy is fairly high (160 KeV) to provide a sufficiently deep base junction to compensate for the faster diffusing P+ emitter and thereby maintaining a reasonable base width. Due to subsequent diffusion operations, this implant profile is somewhat smoothed which results in a doping profile that is essentially flat in the top 3000 Å of the silicon surface. This is shown in FIG. 25b. In the compensated drain case, the P base implant profile is more peaked with the maximum concentration being near or at the surface of the silicon. This is because the implant is performed through an oxide and because the final P base junction depth does not need to be as deep as the N base junction. (The corresponding N+ Emitter does not diffuse as fast or as deep as the P+ Emitter.) Also, the P base is subjected to a reduced thermal budget as compared to the N base, so the same degree of smoothing does not take place. The net result of the N base and P base implants is a profile which actually tails off at the surface of the silicon. This is shown in FIG. 25a where the peak concentration of the compensated drain may actually be 1000 Å deep into the silicon. FIG. 25c is the same data in a two dimensional contour plot which clearly displays that the doping concentration actually depletes near the wafer surface even under polysilicon gate 1350. FIG. 25d is the corresponding contour plot for the conventional drain structure with polysilicon gate indicated by reference numeral 2550.

Figure 26A:
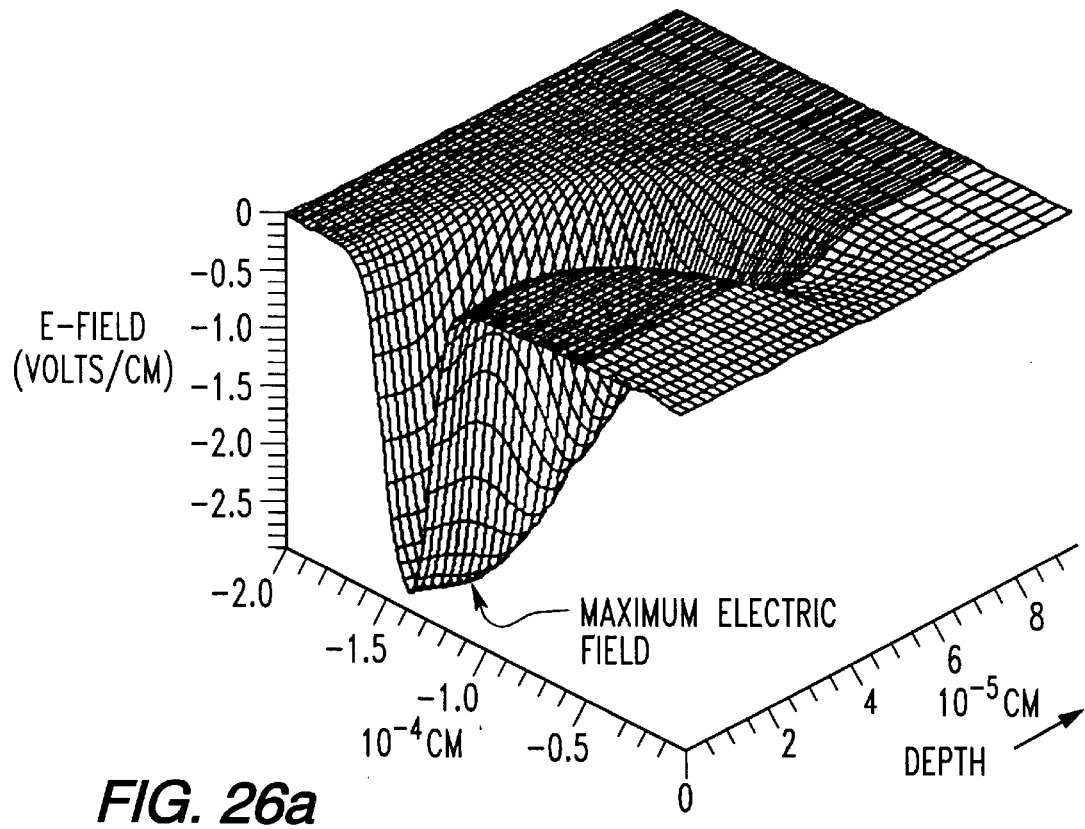
FIGS. 26a–b illustrate comparative electric field intensities.
Figure 26B:
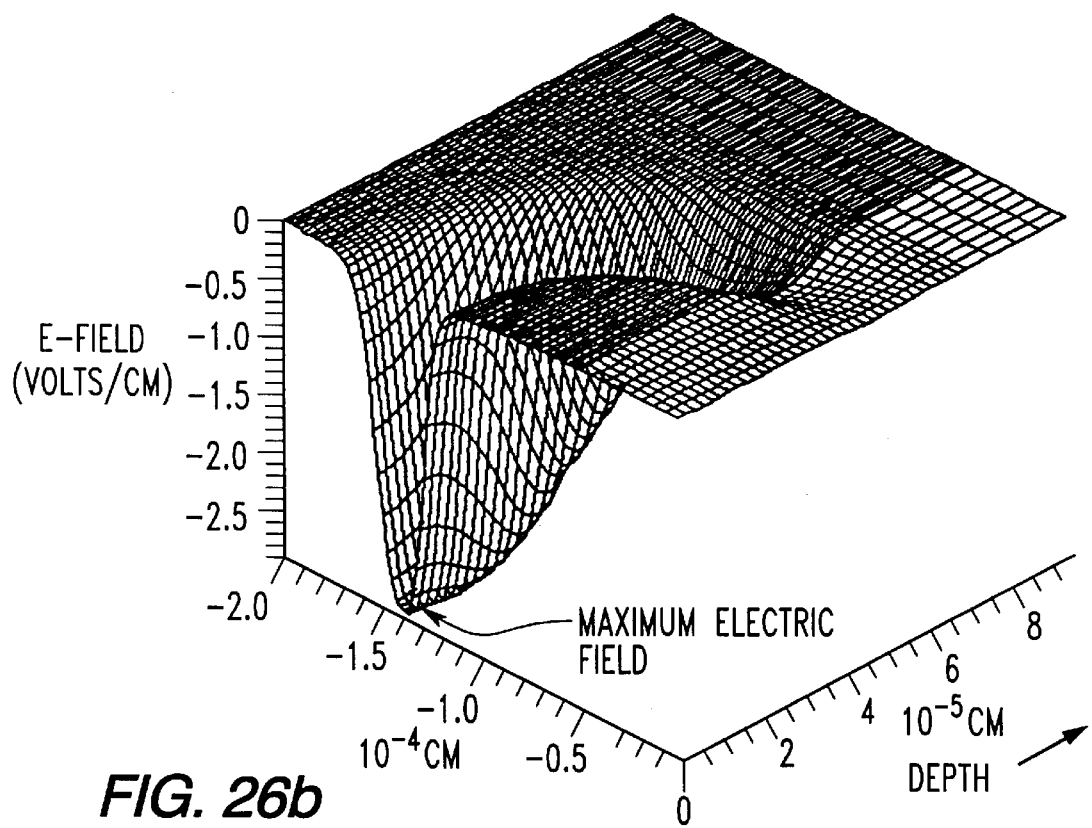

The fact that the peak concentration is buried rather than at the surface has important ramifications with respect to hot electron immunity and device lifetime. Shown in FIGS. 26a–b are the 0 volt bias electric fields for both varieties of drain profiles. The electric field for the conventional drain transistor (FIG. 26b) has a maximum at the surface whereas the maximum electric field for the compensated drain transistor (FIG. 26a) is buried beneath the surface away from the gate oxide. This is a direct result of the doping profiles mentioned above. With the maximum field located away from the silicon/gate oxide interface, there is less chance that the hot electrons generated will penetrate the gate oxide and degrade device lifetime. Hot electrons in the conventional transistor will be generated adjacent to the silicon/gate oxide interface and are likely to generate interface states or be trapped in the gate oxide leading to degraded device lifetimes.

Improved device lifetime and robustness is a direct consequence of the doping profile resulting from the compensated drain architecture. An N base implant, combined with a shallower P base implant result in a pseudo retrograde N-type drain profile. This profile can otherwise only be generated using an expensive, MeV implanter or costly, complicated multi-charged phosphorus implants. The preferred embodiment method is essentially free since the N base and P base implants were already available in the process. By engineering the base implants appropriately, a unique, compensated drain structure can be achieved which is robust, easily manufactured and does not require costly equipment or additional unit processes.

Figure 27A:
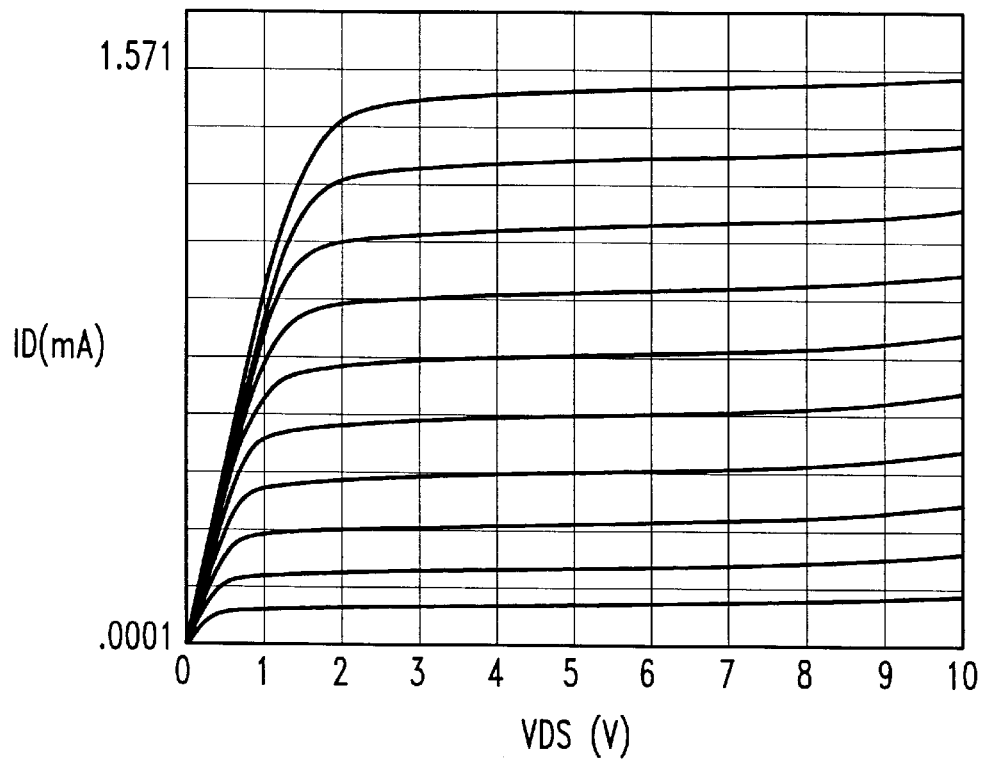
FIGS. 27a–b show comparative device characteristics.
Figure 27B:
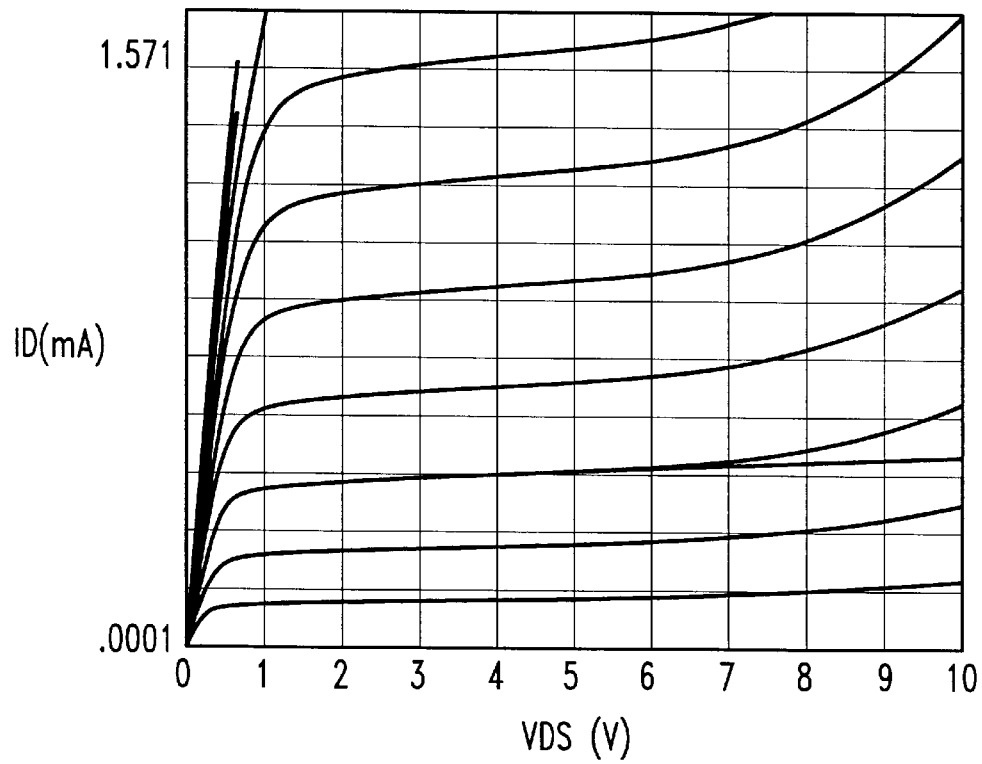

FIGS. 27a–b compare the characteristics of a high voltage NMOS transistor having the compensated drain 1450 (Phosphorus equal $5.0 \times 10^{13}$ atoms/cm$^2$ plus boron equal $4.7 \times 10^{13}$ atoms/cm$^2$) with the characteristics of a high voltage NMOS transistor having the uncompensated drain with both devices having a nominal gate length of 2.4 $\mu$m and a nominal gate width of 50 $\mu$m. The drive current of the compensated drain device is reduced but the I-V characteristics are much more linear which eases mixed signal circuit designs. Indeed, just increasing the gate width will increase drive current. The uncompensated drain device has an expected lifetime of 10 years at 11 volts, whereas the compensated drain device has an expected lifetime of 10 years at 15 volts.

The use of the preferred embodiment compensated drain high voltage NMOS transistor permits optimization of both the base carrier concentration for the PNP transistors and the drain carrier concentration for the high voltage NMOS because the required NPN base dose will provide sufficient NPN charactertistics due to the robustness of NPN transistors. Without drain compensation, the PNP base carrier concentration directly determines the high voltage NMOS drain carrier concentration, and a tradeoff must be considered. More explicitly, the following table indicates implant doses per $cm^2$ for various size and voltage devices and how the compensated drain can be varied without much change to the NPN base.

TABLE

| Operation voltage | Line width | PNP base | NPN base | NMOS drain |
| --- | --- | --- | --- | --- |
| 10 volts | 2.5 $\mu$m | $1.2 \times 10^{14}$ | $7 \times 10^{13}$ | $5 \times 10^{13}$ |
| 10 volts | 2.0 $\mu$m | $1.2 \times 10^{14}$ | $9 \times 10^{13}$ | $3 \times 10^{13}$ |
| 10 volts | 1.5 $\mu$m | $1.2 \times 10^{14}$ | $1.1 \times 10^{14}$ | $1 \times 10^{13}$ |
| 15 volts | 3.0 $\mu$m | $1.2 \times 10^{14}$ | $1.7 \times 10^{14}$ | $1 \times 10^{13}$ |
| 15 volts | 2.5 $\mu$m | $1.2 \times 10^{14}$ | $1.13 \times 10^{14}$ | $7 \times 10^{12}$ |
| 15 volts | 2.0 $\mu$m | $1.2 \times 10^{14}$ | $1.15 \times 10^{14}$ | $5 \times 10^{12}$ |
| 20 votls | 2.0 $\mu$m | $1.2 \times 10^{14}$ | $1.17 \times 10^{14}$ | $3 \times 10^{12}$ |

Further Modifications and Variations

Figure 28:
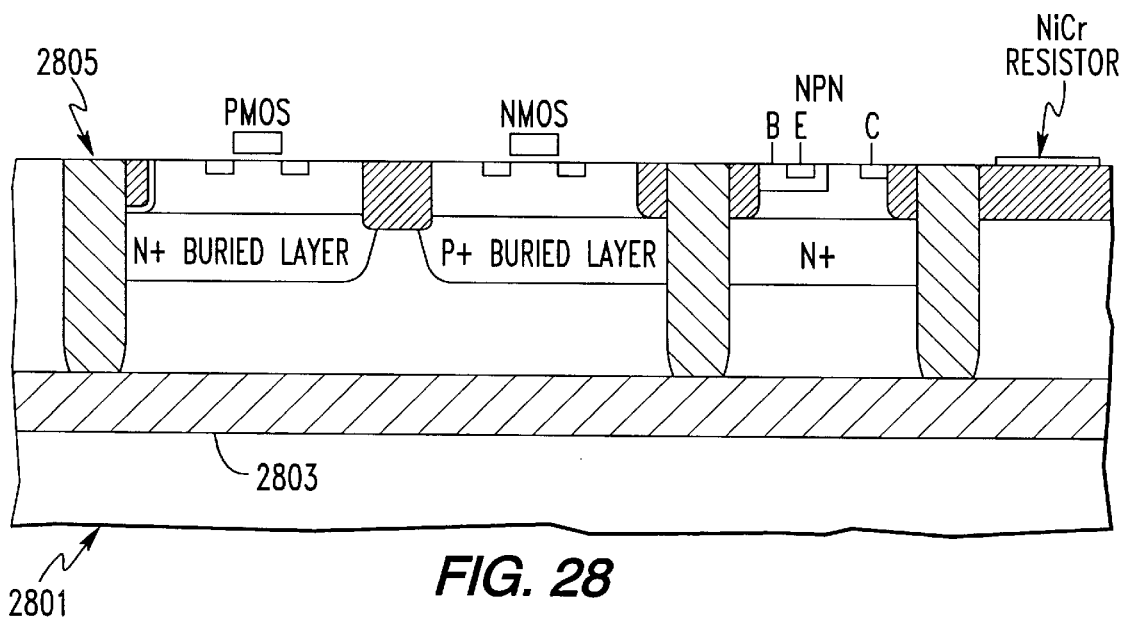
FIGS. 28–29 show aspects of the alternative embodiments.

Various processes such as metal, polysilicon or polycide gate, triple level metal, silicon-on-insulator, and so forth could be used. P-type regions and devices can be interchanged with N-types. Indeed, FIG. 28 shows a cross sectional elevation view of devices made according to the preferred embodiment method of fabrication modified for buried oxide substrate 2801. Substrate 2801 contains buried oxide layer 2803, which can be either implanted or created by bonding wafers or by other dielectric isolation techniques; the substrate below oxide 2803 need not be monocrystalline and may even be insulator as in substrate 2801 being silicon-on-sapphire. Deep trenches 2805 penetrate to buried oxide 2803 to isolate subcircuits, not every device, and extends the idea of pseudosubstrate 360 for digital CMOS. This effectively isolates the digital noise from the analog circuits. A modified fabrication method would proceed as follows: start with a substrate having 2–5 $\mu$m of silicon over an oxide layer; then implant buried layers and grow an epitaxial layer as in the first preferred embodiment. Etch deep trenches and refill them (with dielectric, oxide/ polysilicon, etc.) and planarize. Then continue as with the first preferred embodiment. For greater density seal the shallow trench sidewalls (ROI in first preferred embodiment) for prevention of lateral encroachment during the isolation oxidation (e.g., SWAMI type process or poly-buffered LOCOS).

Figure 29:
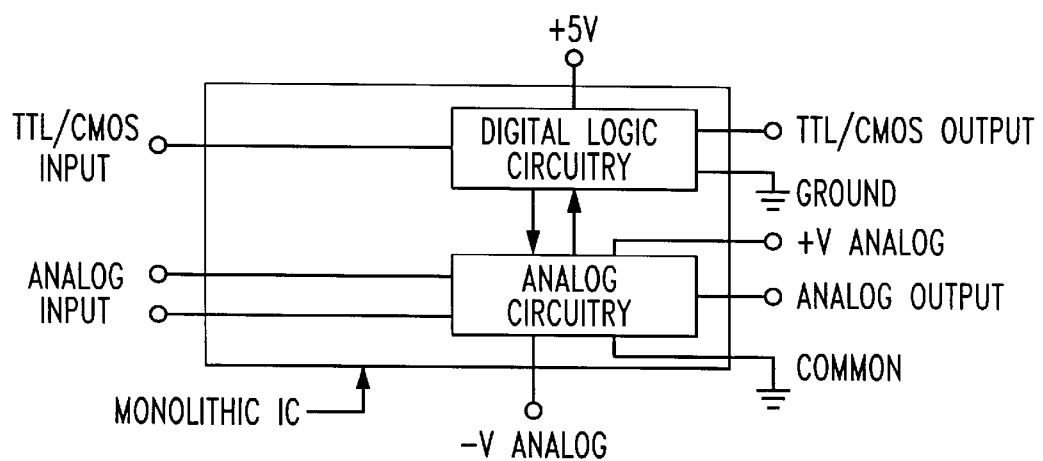

Other variations of the first preferred embodiment fabrication method include separate digital and analog power supplies and grounds for different voltage ranges for the digital and analog with corresponding different gate oxide thicknesses, drain doping levels, epilayer thicknesses, and so forth. FIG. 29 illustrates the general split between digital and analog circuits where the digital circuits are isolated by the pseudosubstrate and the analog voltage V need not equal the + 5 volts digital power supply. Indeed, the effective separation of good digital and good analog devices permits integration of low noise analog front ends with a significant amount of digital logic to create monolithic items. Examples of such integration include a complete radio with an RF front end plus an audio back end, and a video processor with a front end correlator followed by analog signal processing (filter, modulator, demodulator, limiter) to provide both an analog signal with the base band stripped out and a detection of the carrier which is followed by analog-to-digital conversion of the analog signal plus digital signal processing with the carrier detection providing the timing.

Variations in the first preferred embodiment to enhance the PNP performance include: replacing steps (69)–(70) which implant boron at 100 KeV through 2500 Å thick oxide for PMOS source/drains and PNP emitters with steps immediately following step (62) that will implant boron at 30 KeV through just the mesa oxide and will yield better PNP emitters but shorten the effective channel lengths of the PMOS. Further, less variability in PNP base parameters can be had by an implant separate from the drain extension implant of steps (52)–(53). This separate PNP base implant would follow step (54) and include phosphorus at 180 KeV with a dose of $1\times10^{14}$ions/$cm^2$. The resultant isolated PNP should have a beta of 60, an Early voltage of 15 volts, $f_T$ of 1.3 GHz, and breakdown $BV_{ceo}$ of at least 10 volts. Additional enhancement to the Early voltage of the isolated PNP can come from variations that reduce diffusions, such as dropping step (35) and using quicker gate oxidations.

Another variation providing a PNP which more accurately complements the NPN uses a washed emitter. In particular, P+ emitter implants 1824 and 1830 from step (70) are replaced by a separate implant using the apertured BPSG for alignment as with the NPN emitter implant. The PNP emitter implant follows the NPN emitter implant and cap oxide deposition. The use of washed emitters for the PNP permits the same higher density as with the NPNs and also probably increases the Early voltage of the PNPs up to 20 volts.

The use of the second polysilicon layer 1250 in place of the first polysilicon layer 1010 for the simultaneous doping of polysilicon and substrate has an advantage that less thermal oxide is grown on the locations of the substrate doping because the second gate oxide would be grown prior to second polysilicon layer 1250 deposition. This makes the apertures through the oxide easier to etch. That is, steps (38)–(41) could be moved to follow step (47) with the change that the 185 Å first gate oxide would now be 300 Å second gate oxide. The advantage of using first polysilicon layer for the simultaneous doping is the further heat treatment to diffuse in the phosphorus.

The use of thinner polysilicon for the CMOS gates would permit the use of thinner BPSG. In this case the ratio of the NPN emitter depth to the total oxide thickness etched to form the emitter apertures could be as low as about 1 to 2.

What is claimed is:

1. An integrated circuit, comprising:
   (a) a semiconductor layer:
   (b) NPN transistors formed in said layer;
   (c) PNP transistors formed in said layer; and
   (d) first NMOS transistors with sources and drains formed in said layer, said first NMOS transistors with drains having p-type and n-type dopants and characterized by a dopant concentration equal to the dopant concentration of the base dopants of said PNP transistors minus the dopant concentration of the base dopants of said NPN transistors.

2. The integrated circuit of claim 1, wherein:
   (a) said doping profile of said NMOS transistors drain has a maximum dopant concentration spaced away from the surfaces of said layer.

3. The integrated circuit of claim 1, wherein:
   (a) sources of said first NMOS transistors are more heavily doped than said drains.

4. The integrated circuit of claim 1, further comprising:
(a) PMOS transistors with sources and drains formed in said layer; and
(b) second NMOS transistors with sources and drains formed in said layer, said second NMOS transistors having sources and drains of doping profile equal to the doping profile of said sources of said first NMOS transistors.

* * * * *